United States Patent
Fujita et al.

(10) Patent No.: US 10,048,551 B2
(45) Date of Patent: Aug. 14, 2018

(54) SEMICONDUCTOR DEVICE, DISPLAY DEVICE, AND SEMICONDUCTOR DEVICE MANUFACTURING METHOD

(71) Applicant: Sharp Kabushiki Kaisha, Osaka-shi, Osaka (JP)

(72) Inventors: Tetsuo Fujita, Osaka (JP); Yoshihito Hara, Osaka (JP); Yukinobu Nakata, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 609 days.

(21) Appl. No.: 14/370,996

(22) PCT Filed: Jan. 8, 2013

(86) PCT No.: PCT/JP2013/050064
§ 371 (c)(1),
(2) Date: Jul. 8, 2014

(87) PCT Pub. No.: WO2013/105537
PCT Pub. Date: Jul. 18, 2013

(65) Prior Publication Data
US 2014/0347590 A1    Nov. 27, 2014

(30) Foreign Application Priority Data

Jan. 11, 2012 (JP) .................. 2012-003464

(51) Int. Cl.
*G02F 1/1345* (2006.01)
*H01L 27/12* (2006.01)
(Continued)

(52) U.S. Cl.
CPC ........ *G02F 1/13458* (2013.01); *G02F 1/1368* (2013.01); *G02F 1/134336* (2013.01);
(Continued)

(58) Field of Classification Search
CPC .......... H01L 29/42384; H01L 27/1225; H01L 27/3262; G02F 1/13458; G02F 2001/136295; G02F 2001/13629
See application file for complete search history.

(56) References Cited

U.S. PATENT DOCUMENTS

| 2002/0041354 A1 | 4/2002 | Noh et al. |
| 2006/0145157 A1* | 7/2006 | Choi ................. G02F 1/13458 257/66 |

(Continued)

FOREIGN PATENT DOCUMENTS

| JP | 2002-182230 A | 6/2002 |
| JP | 2007-184610 A | 7/2007 |

(Continued)

OTHER PUBLICATIONS

English translation of WO 2011021439 A1, which is US 2012/0138943 A1.*

(Continued)

*Primary Examiner* — Edward Glick
*Assistant Examiner* — Shan Liu
(74) *Attorney, Agent, or Firm* — Keating & Bennett, LLP

(57) ABSTRACT

A semiconductor device includes a thin-film transistor (101), a terminal portion (102), an interlevel insulating layer (14) including a first insulating layer (12) which contacts with the surface of a drain electrode (11*d*), and a first transparent conductive layer (15), a first dielectric layer (17) and a second transparent conductive layer (19*a*) formed on the interlevel insulating layer (14). The terminal portion (102) includes a lower conductive layer (3*t*), a second semiconductor layer (7*t*) arranged on a gate insulating layer (5), and lower and upper transparent connecting layers (15*t*, 19*t*). The gate insulating layer (5) and the second semiconductor layer (7*t*) have a contact hole (CH2), and their side surfaces located on a side of the contact hole (CH2) are aligned with (Continued)

each other. The lower transparent connecting layer (15*t*) contacts with the lower conductive layer (3*t*) in the contact hole (CH2). And the upper transparent connecting layer (19*t*) contacts with the lower transparent connecting layer (15*t*) at the bottom and on the sidewall of the contact hole (CH2).

7 Claims, 21 Drawing Sheets

(51) Int. Cl.
    *H01L 33/42* (2010.01)
    *G02F 1/1343* (2006.01)
    *G02F 1/1368* (2006.01)

(52) U.S. Cl.
    CPC .......... *H01L 27/124* (2013.01); *H01L 27/127* (2013.01); *H01L 27/1225* (2013.01); *H01L 27/1259* (2013.01); *H01L 33/42* (2013.01); *G02F 2001/134372* (2013.01)

(56) References Cited

U.S. PATENT DOCUMENTS

| | | |
|---|---|---|
| 2007/0158652 A1 | 7/2007 | Lee et al. |
| 2008/0024416 A1 | 1/2008 | Onogi et al. |
| 2008/0113473 A1* | 5/2008 | Heo ................... H01L 27/1214 438/149 |
| 2009/0059110 A1* | 3/2009 | Sasaki ............... G02F 1/134363 349/39 |
| 2009/0179202 A1* | 7/2009 | Hong .................. G02F 1/13458 257/59 |
| 2010/0025677 A1 | 2/2010 | Yamazaki et al. |
| 2011/0003414 A1 | 1/2011 | Choi |
| 2011/0074749 A1* | 3/2011 | Higashi ................... H01L 27/12 345/206 |
| 2011/0084266 A1* | 4/2011 | Yamazaki ........... H01L 27/1225 257/43 |
| 2011/0228602 A1 | 9/2011 | Saito et al. |
| 2012/0138922 A1 | 6/2012 | Yamazaki et al. |
| 2012/0138943 A1* | 6/2012 | Nakahara ................ C22C 21/00 257/59 |
| 2012/0218485 A1* | 8/2012 | Chikama ........... G02F 1/136213 349/39 |
| 2012/0241750 A1* | 9/2012 | Chikama ............. H01L 27/1248 257/71 |

FOREIGN PATENT DOCUMENTS

| | | | |
|---|---|---|---|
| JP | 2008-032899 A | 2/2008 | |
| JP | 2010-56541 A | 3/2010 | |
| JP | 2010-191134 A | 9/2010 | |
| JP | 2010-230744 A | 10/2010 | |
| JP | WO 2011021439 A1 * | 2/2011 | ............. C22C 21/00 |
| JP | WO 2011055474 A1 * | 5/2011 | ....... G02F 1/136213 |
| JP | WO 2011070981 A1 * | 6/2011 | ......... H01L 27/1225 |
| JP | 2011-216177 A | 10/2011 | |
| JP | 2012-134475 A | 7/2012 | |
| WO | 2011/021439 A1 | 2/2011 | |

OTHER PUBLICATIONS

English translation of WO 2011070981 A1, which is US 2012/0241750 A1.*
English translation of WO 2011/055474, which is US 2012/0218485.*
Official Communication issued in International Patent Application No. PCT/JP2013/050064, dated Apr. 16, 2013.

* cited by examiner

*FIG.8*

| | |
|---|---|
| STEP 1 | DEPOSIT GATE-LINE-TO-BE METAL FILM (GT) BY SPUTTERING; |
| | PERFORM PHOTOLITHOGRAPHY (1) ON GT; |
| | PERFORM ETCHING; AND |
| | STRIP PHOTORESIST |
| STEP 2 | FORM GATE INSULATING LAYER (GI) BY CVD; |
| | DEPOSIT IGZO BY SPUTTERING; |
| | PERFORM PHOTOLITHOGRAPHY (2) ON IGZO; |
| | PERFORM WET ETCHING; AND |
| | STRIP PHOTORESIST |
| STEP 3 | FORM PROTECTIVE LAYER (ES) BY CVD; |
| | PERFORM PHOTOLITHOGRAPHY (3) ON ES; |
| | PERFORM ETCHING ON ES; AND |
| | STRIP PHOTORESIST |
| STEP 4 | DEPOSIT SOURCE-LINE-TO-BE METAL FILM (SD) BY SPUTTERING; |
| | PERFORM PHOTOLITHOGRAPHY (4) ON SD; |
| | PERFORM ETCHING; AND |
| | STRIP PHOTORESIST |
| STEP 5 | FORM FIRST INSULATING LAYER (Pas1) BY CVD; |
| | PERFORM PHOTOLITHOGRAPHY (5) ON SECOND INSULATING LAYER (PHOTOSENSITIVE RESIN FILM); AND |
| | BAKE |
| | PERFORM ETCHING (Pas1/GI SIMULTANEOUS ETCHING) |
| | DO CLEANING AFTER ETCHING |
| STEP 6 | DEPOSIT FIRST TRANSPARENT CONDUCTIVE LAYER (COM) BY SPUTTERING; |
| | PERFORM PHOTOLITHOGRAPHY (6) ON COM; |
| | PERFORM WET ETCHING; AND |
| | STRIP PHOTORESIST |
| STEP 7 | FORM DIELECTRIC LAYER (Pas2) BY CVD; |
| | PERFORM PHOTOLITHOGRAPHY (7) ON Pas2; |
| | PERFORM ETCHING ON Pas2; AND |
| | STRIP PHOTORESIST |
| STEP 8 | DEPOSIT SECOND TRANSPARENT CONDUCTIVE LAYER (Pix) BY SPUTTERING; |
| | PERFORM PHOTOLITHOGRAPHY (8) ON Pix; |
| | PERFORM ETCHING; AND |
| | STRIP PHOTORESIST |

SEMICONDUCTOR DEVICE, DISPLAY DEVICE, AND SEMICONDUCTOR DEVICE MANUFACTURING METHOD

TECHNICAL FIELD

The present invention relates to a semiconductor device and display device including a thin-film transistor, and also relates to a method for fabricating a semiconductor device including a thin-film transistor.

BACKGROUND ART

An active-matrix-addressed liquid crystal display device generally includes a substrate on which thin-film transistors (which will also be referred to herein as "TFTs") are provided as switching elements for respective pixels (such a substrate will be referred to herein as a "TFT substrate"), a counter substrate on which a counter electrode, color filters and other members are arranged, a liquid crystal layer which is interposed between the TFT substrate and the counter substrate, and a pair of electrodes to apply a voltage to the liquid crystal layer.

On the TFT substrate, formed are a plurality of source lines, a plurality of gate lines, a plurality of TFTs arranged at their intersections, pixel electrodes to apply a voltage to a light modulating layer such as a liquid crystal layer, storage capacitor lines, storage capacitor electrodes and other components. At an end of the TFT substrate, provided is a terminal portion to connect those source lines and gate lines to respective input terminals of a driver circuit, which may be arranged on either the TFT substrate or on another substrate separately (such as a circuit board).

Various modes of operation have been proposed and adopted for active-matrix-addressed liquid crystal display devices according to their intended application. Examples of those modes of operation include a TN (Twisted Nematic) mode, a VA (Vertical Alignment) mode, an IPS (In-Plane-Switching) mode and an FFS (Fringe Field Switching) mode.

Among these modes, the TN and VA modes are longitudinal electric field modes in which a pair of electrodes that face each other with a liquid crystal layer interposed between them apply an electric field to liquid crystal molecules. On the other hand, the IPS and FFS modes are lateral electric field modes in which a pair of electrodes is provided for one substrate to apply an electric field to liquid crystal molecules parallel to the surface of the substrate (i.e., laterally). According to the lateral electric field method, liquid crystal molecules do not rise with respect to the substrate, and therefore, a wider viewing angle can be achieved than in the longitudinal electric field method, which is beneficial.

Among various modes of operation by the lateral electric field method, in an IPS mode liquid crystal display device, a pair of comb electrodes is formed on a TFT substrate by patterning a metal film, and therefore, the transmittance and aperture ratio will decrease, which is a problem. On the other hand, in an FFS mode liquid crystal display device, the electrodes to be formed on the TFT substrate are transparent, and therefore, the aperture ratio and transmittance can be increased.

FFS mode liquid crystal display devices are disclosed in Patent Documents Nos. 1 and 2, for example.

On the TFT substrate of these display devices, a common electrode and a pixel electrode are arranged over each TFT with an insulating film interposed between them. Among these electrodes, a hole is cut as a slit through the electrode which is located closer to the liquid crystal layer (e.g., the pixel electrode). As a result, generated is an electric field which is represented by electric lines of force that are emitted from the pixel electrode, pass through the liquid crystal layer and the slit hole, and then reach the common electrode. This electric field has a lateral component with respect to the liquid crystal layer. Consequently, a lateral electric field can be applied to the liquid crystal layer.

Recently, people have proposed that an oxide semiconductor be used as a material for the active layer of a TFT instead of a silicon semiconductor. Such a TFT will be referred to herein as an "oxide semiconductor TFT". Since an oxide semiconductor has higher mobility than amorphous silicon, the oxide semiconductor TFT can operate at higher speeds than an amorphous silicon TFT. For example, Patent Document No. 3 discloses an active-matrix-addressed liquid crystal display device which uses an oxide semiconductor TFT as a switching element.

CITATION LIST

Patent Literature

Patent Document No. 1: Japanese Laid-Open Patent Publication No. 2008-32899

Patent Document No. 2: Japanese Laid-Open Patent Publication No. 2002-182230

Patent Document No. 3: Japanese Laid-Open Patent Publication No. 2010-230744

SUMMARY OF INVENTION

Technical Problem

In a TFT substrate including electrodes which are stacked in two layers over each TFT as in a TFT substrate for use in an FFS mode liquid crystal display device, if each of those electrodes in two layers is formed out of a transparent conductive film, the aperture ratio and transmittance can be increased compared to a TFT substrate for use in an IPS mode liquid crystal display device, as described above. In addition, by using an oxide semiconductor TFT, the size of each transistor section on the TFT substrate can be reduced, and therefore, the transmittance can be further increased.

However, as the applications of liquid crystal display devices have become even broader these days and as there are growing demands for high-spec liquid crystal display devices, such liquid crystal display devices should have an even higher degree of reliability. As one of measures to achieve this object, respective terminals to be formed in a terminal portion for the TFT substrate should have their reliability (i.e., weather resistance) increased. None of Patent Documents Nos. 1 to 3 cited above proposes any specific terminal structure.

The present inventors perfected our invention in order to overcome these problems by further increasing the reliability of a semiconductor device such as a TFT substrate or a display device that uses such a semiconductor device.

Solution to Problem

A semiconductor device according to an embodiment of the present invention includes a substrate and a thin-film transistor, a gate line layer, a source line layer and a terminal portion supported on the substrate. The gate line layer includes a gate line, a gate electrode for the thin-film transistor, and a lower conductive layer for the terminal portion. The source line layer includes a source line and source and drain electrodes for the thin-film transistor. The thin-film transistor includes the gate electrode, a gate insulating layer formed on the gate electrode, a first semiconductor layer which is formed on the gate insulating layer and includes an oxide semiconductor, a protective layer which covers at least a channel region of the first semiconductor layer, the source electrode, and the drain electrode. The semiconductor device further includes: an interlevel insulating layer formed on the source and drain electrodes and which includes a first insulating layer that contacts with at least a surface of the drain electrode; a first transparent conductive layer formed on the interlevel insulating layer; a first dielectric layer formed on the first transparent conductive layer; and a second transparent conductive layer formed on the first dielectric layer so as to overlap with at least a portion of the first transparent conductive layer with the first dielectric layer interposed between them. The terminal portion includes: the lower conductive layer; the gate insulating layer extended onto the lower conductive layer; a second semiconductor layer arranged on the gate insulating layer and formed out of the same semiconductor film as the first semiconductor layer; a lower transparent connecting layer which has been formed out of the same conductive film as the first transparent conductive layer; and an upper transparent connecting layer arranged on the lower transparent connecting layer and formed out of the same conductive film as the second transparent conductive layer. The gate insulating layer and the second semiconductor layer have a contact hole. The side surfaces of the gate insulating layer and the second semiconductor layer which locate on a side of the contact hole are aligned with each other. The lower transparent connecting layer has been formed inside the contact hole and on the second semiconductor layer and contacts with the lower conductive layer in the contact hole. And the upper transparent connecting layer contacts with the lower transparent connecting layer at the bottom and on the sidewall of the contact hole.

In one embodiment, the side surface of the lower transparent connecting layer is aligned with another side surface of the second semiconductor layer on an opposite side of the contact hole.

In one embodiment, an end portion of the upper transparent connecting layer is located on the lower transparent connecting layer.

In one embodiment, the upper transparent connecting layer covers another side surface of the second semiconductor layer on an opposite side of the contact hole.

In one embodiment, the semiconductor device further includes a second dielectric layer between the upper and lower transparent connecting layers, the second dielectric layer being formed out of the same dielectric film as the first dielectric layer.

In one embodiment, the second dielectric layer covers another side surface of the semiconductor layer on an opposite side of the contact hole.

A display device according to an embodiment of the present invention includes: a semiconductor device according to any of the embodiments described above; a counter substrate arranged so as to face the semiconductor device; and a liquid crystal layer interposed between the counter substrate and the semiconductor device. The display device includes a plurality of pixels which are arranged in a matrix pattern. And the second transparent conductive layer is divided into multiple portions which are allocated to the respective pixels and which function as pixel electrodes.

In one embodiment, the second transparent conductive layer has a plurality of slit holes in each pixel, and the first transparent conductive layer is located at least under the plurality of holes and functions as a common electrode.

A semiconductor device fabricating method according to an embodiment of the present invention is a method for fabricating a semiconductor device including a thin-film transistor and a terminal portion. The method includes the steps of: (a) forming a lower conductive layer and a gate line layer including a gate line and gate electrode on a substrate; (b) forming a gate insulating layer to cover the gate line layer; (c) forming an oxide semiconductor film on the gate insulating layer and patterning the oxide semiconductor film, thereby forming a first semiconductor layer, at least a part of which overlaps with the gate electrode, and a second semiconductor layer which has a first hole over the lower conductive layer; (d) forming a protective layer to cover at least a portion of the first semiconductor layer to be a channel region and the upper surface of the second semiconductor layer; (e) forming a conductive film over a surface of the substrate having the protective layer formed thereon and patterning the conductive film, thereby forming a source line layer including source and drain electrodes that contact with the first semiconductor layer; (f) forming a first insulating film on the surface of the substrate having the source line layer formed thereon and etching the first insulating film, the gate insulating layer and the protective layer simultaneously, the step (f) including removing a portion of the protective layer located on the second semiconductor layer and removing the first insulating film and the gate insulating layer using the second semiconductor layer as an etching mask to expose the lower conductive layer, thereby forming a contact hole in the second semiconductor layer and the gate insulating layer; (g) forming a lower transparent connecting layer inside the contact hole and on the second semiconductor layer so that the lower transparent connecting layer contacts with the lower conductive layer inside the contact hole; and (h) forming an upper transparent connecting layer on the lower transparent connecting layer so that the upper transparent connecting layer contacts with the lower transparent connecting layer at the bottom and on the side surface of the contact hole.

In one embodiment, the step (g) includes the steps of forming a transparent conductive film inside the contact hole and on the second semiconductor layer and etching the transparent conductive film and the second semiconductor layer simultaneously.

In one embodiment, the method further includes, between the steps (g) and (f), the step of forming a dielectric layer on a portion of the lower transparent conductive layer. In the step (f), the upper transparent connecting layer is formed so as to contact with the lower transparent conductive layer and the dielectric layer.

A semiconductor device according to another embodiment of the present invention includes a substrate and a terminal portion supported on the substrate. The terminal portion includes: a lower conductive layer formed on the substrate; an insulating layer which covers the lower conductive layer; a semiconductor layer which is formed on the insulating layer and which includes an oxide semiconductor; a lower transparent connecting layer; and an upper transparent connecting layer arranged as a transparent layer on the lower transparent connecting layer. The insulating layer and the semiconductor layer have a contact hole. The respective side surfaces of the insulating layer and the semiconductor layer which locate on a side of the contact hole are aligned with each other. The lower transparent connecting layer is formed inside the contact hole and on the semiconductor layer and contacts with the lower conductive layer inside the contact hole. And the upper transparent connecting layer contacts with the lower transparent connecting layer at the bottom and on the sidewall of the contact hole.

In one embodiment, the oxide semiconductor includes an In—Ga—Zn—O-based semiconductor.

A semiconductor device fabricating method according to another embodiment of the present invention is a method for fabricating a semiconductor device including a terminal portion. The method includes the steps of: (A) forming a lower conductive layer on a substrate; (B) forming an insulating layer to cover the lower conductive layer; (C) forming, on the insulating layer, a semiconductor layer which has a first hole over the lower conductive layer and which includes an oxide semiconductor; (D) forming a protective layer which covers the semiconductor layer; (E) forming a first insulating film on the protective layer and inside the first hole; (F) etching the first insulating film, the insulating layer and the protective layer simultaneously, the step (F) including exposing a part of the lower conductive layer by removing the protective layer and removing the first insulating film and the insulating layer using the semiconductor layer as an etching mask, thereby forming a contact hole in the insulating layer and the semiconductor layer; (G) forming a lower transparent connecting layer inside the contact hole and on the semiconductor layer so that the lower transparent connecting layer contacts with the lower conductive layer inside the contact hole; and (H) forming an upper transparent connecting layer on the lower transparent connecting layer so that the upper transparent connecting layer contacts with the lower transparent connecting layer at the bottom and on the side surface of the contact hole.

In one embodiment, the oxide semiconductor includes an In—Ga—Zn—O-based semiconductor.

Advantageous Effects of Invention

In an embodiment of the present invention, in a semiconductor device including a TFT, a first transparent conductive layer which has been formed on the TFT and a second transparent conductive layer which has been formed on the first transparent conductive layer with a dielectric layer interposed between them, terminals with a redundant structure are formed by using the first and second transparent conductive layers. As a result, the reliability of the terminal portion can be increased.

In addition, according to an embodiment of the present invention, a semiconductor device with such a terminal portion can be fabricated efficiently enough without increasing the number of masks to use.

BRIEF DESCRIPTION OF DRAWINGS

FIG. 8 Shows the flow of the manufacturing process of the semiconductor device 100.

DESCRIPTION OF EMBODIMENTS

Hereinafter, embodiments of a semiconductor device, display device and method for fabricating a semiconductor device according to the present invention will be described with reference to the accompanying drawings. It should be noted, however, that the present invention is in no way limited to the illustrative embodiments to be described below.

Embodiment 1

A first embodiment of a semiconductor device according to the present invention is a TFT substrate for use in an active-matrix-addressed liquid crystal display device. In the following description, a TFT substrate for use in an FFS mode display device will be described as an example. It should be noted that a semiconductor device according to this embodiment just needs to include a TFT and two transparent conductive layers on a substrate, and therefore, may also be implemented as a TFT substrate for use in a liquid crystal display device operating in any other mode or various kinds of display devices and electronic devices other than a liquid crystal display device.

Figure 1:
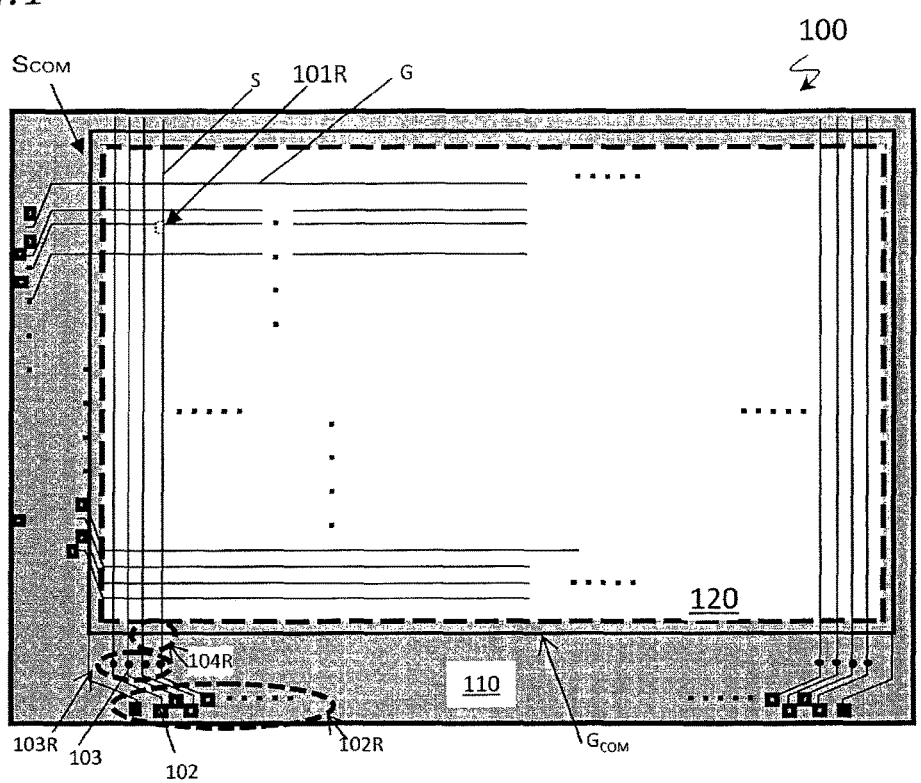
FIG. 1 Schematically illustrates an exemplary planar structure for a semiconductor device (TFT substrate) 100 according to an embodiment of the present invention.

FIG. 1 schematically illustrates an exemplary planar structure for a semiconductor device (TFT substrate) 100 according to this embodiment. This semiconductor device 100 includes a display area (active area) 120 which contributes to a display operation and a peripheral area (frame area) 110 which is located outside of the active area 120.

In the display area 120, a plurality of gate lines G and a plurality of source lines S have been formed, and each region surrounded with these lines defines a "pixel". As shown in FIG. 1, those pixels are arranged in a matrix pattern. A pixel electrode (not shown) has been formed in each pixel. Although not shown, in each pixel, a thin-film transistor (TFT) has been formed as an active element in the vicinity of each intersection between the source lines S and the gate lines G. Each TFT is electrically connected to its associated pixel electrode via a contact portion. In this description, a region where a TFT and a contact portion are formed will be referred to herein as a "transistor forming region 101R". In addition, according to this embodiment, a common electrode (not shown) is arranged under each pixel electrode so as to face the pixel electrode with a dielectric layer (insulating layer) interposed between them. A common signal (which will be referred to herein as a "COM signal") is applied to the common electrode.

In the peripheral area 110, terminal portions 102, each of which electrically connects either a gate line G or a source line S to an external line, have been formed. Optionally, an S-G connecting portion 103 (i.e., a portion to change connections from a source line S to a gate line G) to be connected to a connector line which has been formed out of the same conductive film as the gate line G may be provided between each source line S and its associated terminal portion 102. In that case, the connector line is connected to the external line in the terminal portion 102. In this description, a region where a plurality of terminal portions 102 are formed will be referred to herein as a "terminal portion forming region 102R" and a region where the S-G connecting portion 103 is formed will be referred to herein as an "S-G connecting portion forming region 103R".

Also, in the example illustrated in FIG. 1, further formed in the peripheral area 110 are COM signal lines $S_{COM}$ and $G_{COM}$ to apply a COM signal to the common electrode, COM-G connecting portions (not shown) to connect the COM signal lines $G_{COM}$ to the common electrode, and COM-S connecting portions (not shown) to connect the COM signal lines $S_{COM}$ to the common electrode. Even though the COM signal lines $S_{COM}$ and $G_{COM}$ are arranged in this example in a ring pattern so as to surround the display area 120, the planar shapes of the COM signal lines $S_{COM}$ and $G_{COM}$ are not particularly limited.

In this example, the COM signal lines $S_{COM}$ which run parallel to the source lines S have been formed out of the same conductive film as the source lines S, and the COM signal lines $G_{COM}$ which run parallel to the gate lines G have been formed out of the same conductive film as the gate lines G. These COM signal lines $S_{COM}$ and $G_{COM}$ may be electrically connected together in the vicinity of the respective corners of the display area 120 in the peripheral area 110, for example. It should be noted that the conductive film to make the COM signal lines does not have to be the one described above. Optionally, the entire COM signal lines may have been formed out of the same conductive film as either the gate lines G or the source lines S.

Each COM-G connecting portion to connect the COM signal line $G_{COM}$ to the common electrode may be arranged between adjacent source lines S so as not to overlap with the S-G connecting portion 103 in the peripheral area 110. In this description, the region where the COM-G connecting portion is formed will be referred to herein as a "COM-G connecting portion forming region 104R".

Although not shown in FIG. 1, COM-S connecting portions to connect the COM signal lines $S_{COM}$ to the common electrode may be arranged in the peripheral area 110.

Depending on the mode of operation of the display device to which this semiconductor device 100 is applied, the counter electrode does not have to be a common electrode. In that case, the COM signal lines and COM-G connecting portions do not have to be provided in the peripheral area 110. Also, if this semiconductor device 100 is applied to a display device to operate in the longitudinal electric field driving mode, for example, the transparent conductive layer which is arranged to face the pixel electrodes with a dielectric layer interposed between them does not have to function as an electrode.

<Terminal Portion Forming Region 102R>

First of all, the structure of the terminal portions on the TFT substrate of this embodiment will be described. FIGS. 2(a) and 2(b) are respectively a plan view and a cross-sectional view illustrating a terminal portion which has been formed in the peripheral area of the TFT substrate. Even though two adjacent terminals are illustrated in FIG. 2(b), the number of terminals is not particularly limited.

The terminal portion 102 includes a lower conductive layer 3t which is arranged on a substrate 1, a gate insulating layer 5 which has been extended so as to cover the lower conductive layer 3t, and a semiconductor layer 7t which has been formed out of an oxide semiconductor on the gate insulating layer 5. A contact hole CH has been cut through the gate insulating layer 5 and the semiconductor layer 7t so as to partially expose the lower conductive layer 3t (i.e., so as to reach the lower conductive layer 3t). That is to say, the contact hole CH is defined by the respective holes 5q, 7q of the gate insulating layer 5 and the semiconductor layer 7t. On the sidewall of the contact hole CH, the side surface of the gate insulating layer 5 which faces the hole 5q (i.e., its side surface which fronts the contact hole CH) and the side surface of the semiconductor layer 7t which faces the hole 7q (i.e., its side surface which fronts the contact hole CH) are aligned with each other.

A lower transparent connecting layer 15t has been formed on the semiconductor layer 7t and inside the contact hole CH. The lower transparent connecting layer 15t contacts with the lower conductive layer 3t inside the contact hole CH. An upper transparent connecting layer 19t has been stacked on the lower transparent connecting layer 15t. The upper transparent connecting layer 19t contacts with the lower transparent connecting layer 15t at the bottom and on the side surface of the contact hole CH. In this terminal portion 102, electrical connection can be established between the upper transparent connecting layer 19t and the lower conductive layer 3t via the lower transparent connecting layer 15t.

Figure 2:
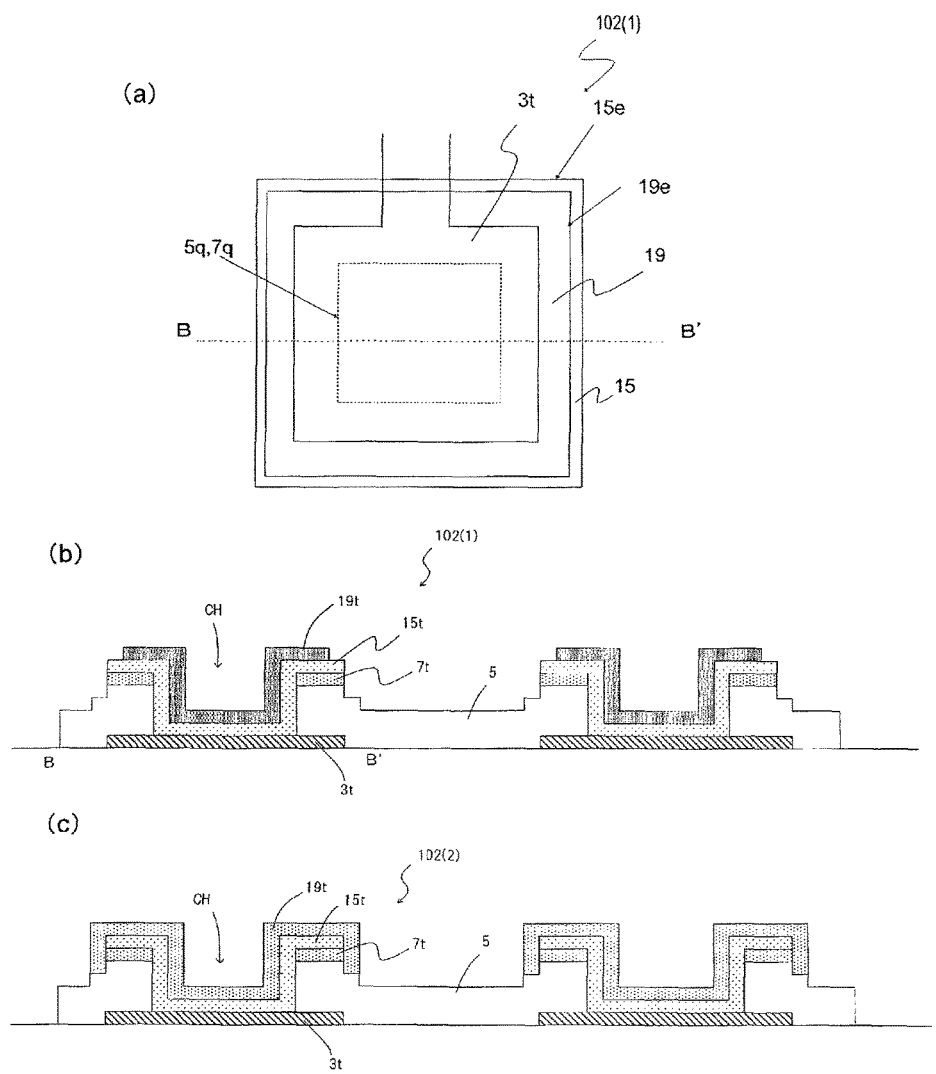
FIGS. 2(a) and (b) are respectively a plan view and a cross-sectional view illustrating a terminal portion 102 which has been formed in the peripheral area of a TFT substrate according to a first embodiment of the present invention and (c) is a cross-sectional view illustrating another exemplary terminal portion 102.

In the example illustrated in FIG. 2, the lower conductive layer 3t may have been formed out of the same conductive film as the gate lines 3, for example. The lower conductive layer 3t may be connected to the gate lines 3 (in the gate terminal portions) or may be connected to the source lines 11 via the S-G connecting portions (in the source terminal portions).

The terminal portion 102 of this embodiment has a redundant structure comprised of the lower transparent connecting layer 15t and the upper transparent connecting layer 19t. That is why an increase in resistance which would be caused due to disconnection of a conductive film at an edge of a depressed portion that has been cut through the gate insulating layer 5 and the semiconductor layer 7t can be minimized, and therefore, the reliability can be increased compared to the conventional structures. In addition, since the semiconductor layer 7t can be used according to this embodiment as an etching mask in the process step of cutting a hole 5q through the gate insulating layer 5 as will be described later, a terminal portion 102 with such a redundant structure can be made without complicating the manufacturing process.

If this embodiment is applied to a TFT substrate for use in an FFS mode display device, the lower transparent connecting layer 15t is suitably formed out of the same transparent conductive film as the common electrode, and the upper transparent connecting layer 19t is suitably formed out of the same conductive film as the pixel electrodes. By using such a pair of electrode layers to be the common electrode and the pixel electrodes, a terminal portion 102 with the redundant structure can be formed with an increase in the number of manufacturing process steps or the number of masks to use checked.

When viewed along a normal to the substrate 1, the semiconductor layer 7t and the upper and lower transparent connecting layers 19t, 15t suitably overlap with each other. That is to say, the upper transparent connecting layer 19t suitably covers a portion of the lower transparent connecting layer 15t which is located over the semiconductor layer 7t, too. In that case, such an increase in resistance due to disconnection around the edge can be checked with even more certainty. In the example illustrated in FIG. 2(a), an end portion 19e of the upper transparent connecting layer 19t is located on the lower transparent connecting layer 15t. However, the upper transparent connecting layer 19t may cover the entire upper surface of the lower transparent connecting layer 15t, too. For example, the upper transparent connecting layer 19t may cover not only the entire upper surface of the lower transparent connecting layer 15t but also other side surface of the lower transparent connecting layer 15t and the semiconductor layer 7t opposite from the hole 7q as well as shown in FIG. 2(c).

In this embodiment, the side surface of the semiconductor layer 7t which faces the hole 7q is aligned with the side surface of the gate insulating layer 5 which faces the hole 5q. Such a structure can be obtained by cutting the hole 5q through the gate insulating layer 5 using the semiconductor layer 7t as an etching mask as will be described later. On the other hand, another side surface of the semiconductor layer 7t opposite from the hole 7q may be aligned with the side surface of the lower transparent connecting layer 15t. Such a structure can be obtained by etching the semiconductor layer 7t and the lower transparent connecting layer 15t simultaneously.

In this description, if two or more different layers "have their side surfaces aligned with each other", the side surfaces of those layers may not only be vertically aligned with each other but also define a continuous sloped surface such as a tapered surface. Such a configuration can be obtained by etching those layers through the same mask, for example.

<Transistor Forming Region 101R>

The semiconductor device 100 of this embodiment includes a TFT 101 and a contact portion 105(1) to connect the TFT 101 to its associated pixel electrode in each pixel. In this embodiment, the contact portion 105(1) is also arranged in the transistor forming region 101R.

Figure 3:
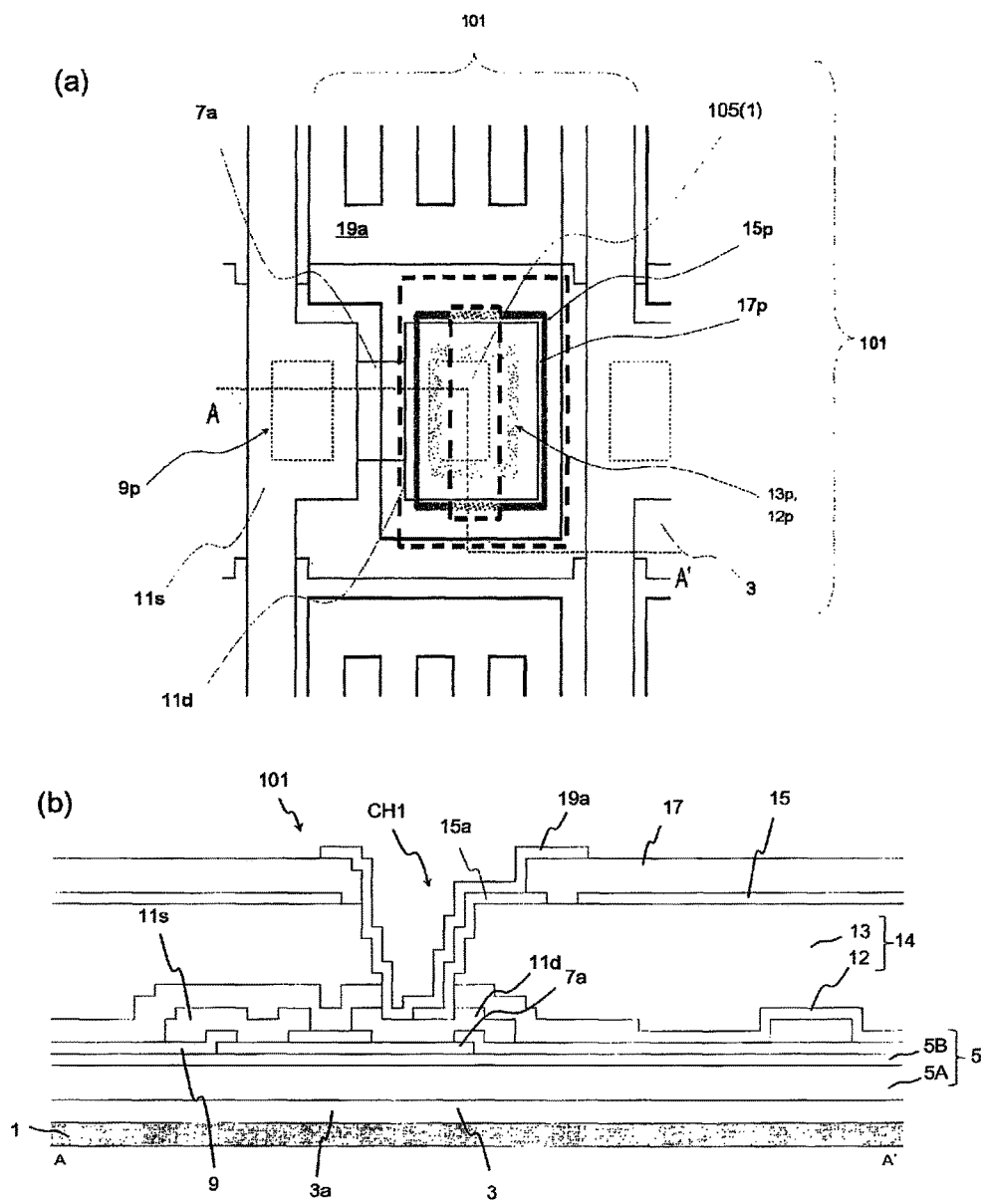
FIGS. 3(a) and (b) are respectively a plan view and a cross-sectional view illustrating a TFT 101 and contact portion 105(1) according to the first embodiment of the present invention.

FIGS. 3(a) and 3(b) are respectively a plan view and a cross-sectional view illustrating a TFT 101 and contact portion 105(1) according to this embodiment. Even though a surface which is tilted with respect to the substrate 1 (such as a tapered portion) is indicated by stepped lines in the cross-sectional view shown in FIG. 3(b), actually the surface is a smooth sloped surface. The same can be said about each of the other cross-sectional views attached to the present application.

The semiconductor device 100 of this embodiment includes a TFT 101 and a contact portion 105(1) to connect the TFT 101 to its associated pixel electrode in each pixel. In this embodiment, the contact portion 105(1) is also arranged in the transistor forming region 101R.

In the transistor forming region 101R, there are a TFT 101, an insulating layer 14 which covers the TFT 101, a drain connected transparent conductive layer 15a which is arranged on the insulating layer 14 and not electrically connected to the first transparent conductive layer 15, and a second transparent conductive layer 19a which is arranged over the first transparent conductive layer 15 with a dielectric layer (insulating layer) 17 interposed between them. Also, the drain electrode 11d of the TFT 101 and the second transparent conductive layer 19a are electrically connected together inside a first contact hole CH1 which has been cut through the interlevel insulating layer 14 and the dielectric layer 17. In this description, the insulating layer 14 which has been formed between the first transparent conductive layer 15 and the TFT 101 will be referred to herein as an "interlevel insulating layer", and an insulating layer which has been formed between the first and second transparent conductive layers 15 and 19a and which forms capacitance with these conductive layers 15 and 19a will be referred to herein as a "dielectric layer". In this embodiment, the interlevel insulating layer 14 includes a first insulating layer 12 which has been formed in contact with the drain electrode 11d of the TFT 101 and a second insulating layer 13 which has been formed on the first insulating layer 12.

The TFT 101 includes a gate electrode 3a, a gate insulating layer 5 which has been formed on the gate electrode 3a, a semiconductor layer 7a which has been formed on the gate insulating layer 5, and source and drain electrodes 11s and 11d which have been formed in contact with the semiconductor layer 7a. When viewed along a normal to the substrate 1, at least a portion of the semiconductor layer 7a to be a channel region is arranged so as to overlap with the gate electrode 3a with the gate insulating layer 5 interposed between them. In addition, a protective layer 9 has also been formed so as to cover at least that portion of the semiconductor layer 7a to be a channel region. The source and drain electrodes 11s, 11d may contact with the semiconductor layer 7a inside holes that have been cut through the protective layer 9.

The gate electrode 3a has been formed out of the same conductive film as the gate line 3 so that the gate electrode 3a and the gate line 3 form parts of the same layer. In this description, such a layer which has been formed out of the same conductive film as the gate line 3 will be collectively referred to herein as a "gate line layer". Thus, the gate line layer includes the gate line 3 and the gate electrode 3a. The gate line 3 includes a portion which functions as the gate of the TFT 101 and which will be the gate electrode 3a described above. Also, in this description, a pattern of which the gate electrode 3a and the gate line 3 form integral parts will be sometimes referred to herein as a "gate line 3". When viewed along a normal to the substrate 1, the gate line 3 includes a portion which runs in a predetermined direction and an extended portion which is extended from that portion to run in a different direction from the predetermined one. And that extended portion may function as the gate electrode 3a. Or when viewed along a normal to the substrate 1, the gate line 3 may have a plurality of linear portions which have a constant width and which run in a predetermined direction and some of those linear portions may overlap with the channel region of the TFT 101 and function as the gate electrode 3a.

The source and drain electrodes 11s and 11d have been formed out of the same conductive film as the source line 11. In this description, such a layer which has been formed out of the same conductive film as the source line 11 will be collectively referred to herein as a "source line layer". Thus, the source line layer includes the source line and the source and drain electrodes 11s and 11d. The source electrode 11s is electrically connected to the source line 11. The source line 11 may include a portion which runs in a predetermined direction and an extended portion which is extended from that portion to run in a different direction from the predetermined one. And that extended portion may function as the source electrode 11s.

The interlevel insulating layer 14 and the dielectric layer 17 have a first contact hole CH1 which reaches the surface of (i.e., which exposes) the drain electrode 11d of the TFT 101. In the first contact hole CH1, the drain electrode 11d of the TFT 101 and the second transparent conductive layer 19a are electrically connected together. In this example, in the first contact hole CH1, a portion of the surface of the drain electrode 11d contacts with the drain connected transparent conductive layer 15a and another portion thereof contacts with the second transparent conductive layer 19a. Optionally, the second transparent conductive layer 19a and the drain electrode 11d may be connected together via the drain connected transparent conductive layer 15a as will be described later. In this description, a portion where the drain electrode 11d of the TFT 101 contacts with a transparent conductive layer that has been formed over the drain electrode 11d (i.e., the drain connected transparent conductive layer 15a and the second transparent conductive layer 19a in this example) will be referred to herein as a "contact portion".

As shown in FIG. 3(b), the gate insulating layer 5 may have a multilayer structure comprised of a first gate insulating layer 5A and a second gate insulating layer 5B which has been stacked on the first gate insulating layer 5A.

Of the interlevel insulating layer 14, the first insulating layer 12 which is arranged closer to the TFT 101 may be an inorganic insulating layer, for example, and has been formed so as to contact with a portion of the drain electrode 11d. The first insulating layer 12 functions as a passivation layer. The second insulating layer 13 which has been formed on the first insulating layer 12 may be an organic insulating film. Although the interlevel insulating layer 14 has a double layer structure in the example illustrated in FIG. 3(b), the interlevel insulating layer 14 may also have a single layer structure consisting of only the first insulating layer 12 or may even have a multilayer structure consisting of three or more layers.

The first transparent conductive layer 15 may function as a common electrode, for example, and has a hole 15p. The drain connected transparent conductive layer 15a has been formed out of the same conductive film as the first transparent conductive layer 15 but is not electrically connected to the first transparent conductive layer 15.

The second transparent conductive layer 19a may function as a pixel electrode, for example, and has been divided into multiple portions for respective pixels in this example. Also, the second transparent conductive layer 19a has a plurality of slit holes.

The second transparent conductive layer 19a is arranged so as to overlap at least partially with the first transparent conductive layer 15 with the dielectric layer 17 interposed between them when viewed along a normal to the substrate 1. That is why capacitance is produced in that overlapping portion between those two conductive layers 15 and 19a. The capacitance can function as a storage capacitor for a display device.

The contact portion 105(1) is arranged so as to overlap at least partially with the gate line layer (i.e., either the gate line 3 or the gate electrode 3a in this case) when viewed along a normal to the substrate 1.

Hereinafter, the shapes of the contact portion 105(1) and contact hole CH1 will be described with reference to FIG. 3(a). The first contact hole CH1 is defined by the holes that have been cut through the first transparent conductive layer 15, the dielectric layer 17, the second insulating layer 13 and the first insulating layer 12. In FIG. 3(a), exemplary profiles of the respective holes of the first transparent conductive layer 15, dielectric layer 17, second insulating layer 13 and first insulating layer 12 are indicated by the lines 15p, 17p, 13p and 12p, respectively.

In this description, if the side surface of a hole that has been cut through the respective layers is not perpendicular to the substrate 1 but if the size of the hole changes with the depth (e.g., if the hole has a tapered shape), the profile of the hole at a depth at which the hole has the smallest size will be referred to herein as the "profile of the hole". That is why in FIG. 3(a), the profile of the hole 13p of the second insulating layer 13, for example, is the profile at the bottom of the second insulating layer 13 (i.e., at the interface between the second and first insulating layers 13 and 12).

Both of the holes 17p and 13p are located inside of the hole 15p of the first transparent conductive layer 15. That is why the first transparent conductive layer 15 is not exposed on the sidewall of the first contact hole CH1. The hole 12p of the first insulating layer 12 may be aligned with the hole 13p of the second insulating layer 13. These holes 17p and 13p are arranged so as to at least partially overlap with each other. And that overlapping portion between these holes 17p and 13p corresponds to the hole 12p of the first insulating layer 12 which contacts with the drain electrode 11d. In this embodiment, the holes 17p and 13p are arranged so that at least part of the hole 13p of the second insulating layer 13 is located inside of the profile of the hole 17p of the dielectric layer 17. In the example illustrated in FIG. 3(a), the entire hole 13p of the second insulating layer 13 is located inside of the profile of the hole 17p of the dielectric layer 17.

Inside the hole 15p, a drain connected transparent conductive layer 15a has been formed so as to be electrically isolated from the first transparent conductive layer 15. In this example, the drain connected transparent conductive layer 15a covers a part of the side surface of the hole 13p, a part of the side surface of the hole 12p, and a part of the surface of the drain electrode 11d which is exposed through these holes. Inside the contact hole CH1, the second transparent conductive layer 19a covers the drain connected transparent conductive layer 15a, parts of the surface of the drain electrode 11d and the side surfaces of the holes 12p, 13p which are not covered with the drain connected transparent conductive layer 15a, and the side surface of the hole 17p of the dielectric layer 17.

As will be described later, the first contact hole CH1 is cut by etching the dielectric layer 17 and the first insulating layer 12 and patterning the second insulating layer 13. Since an organic insulating film is used as the second insulating layer 13 according to this embodiment, a hole 13p is cut through the second insulating layer 13 and then the first insulating layer 12 is etched using the second insulating layer 13 as an etching mask. As a result, the side surface of the first insulating layer 12 which faces the hole 12p is aligned with a portion of the side surface of the second insulating layer 13 which faces the hole 13p (i.e., inside the first contact hole CH1 shown in FIG. 3(b)). In this description, if two or more different layers "have their side surfaces aligned with each other", the side surfaces of those layers may not only be vertically aligned with each other but also define a continuous sloped surface such as a tapered surface. Such a configuration can be obtained by etching those layers through the same mask, for example.

Such a contact portion 105(1) may be formed in the following manner, for example. First of all, a TFT 101 is fabricated on the substrate 1. Next, a first insulating layer 12 which contacts with at least the drain electrode 11d of the TFT 101 is formed so as to cover the TFT 101. Subsequently, a second insulating layer 13 with a hole 13p is formed on the first insulating layer 12. Thereafter, the first insulating layer 12 is etched using the second insulating layer 13 as a mask, thereby cutting a hole 12p. By etching the first insulating layer 12, the surface of the drain electrode 11d gets exposed. After that, a first transparent conductive layer 15 with a hole 15p is formed on the second insulating layer 13 and a drain connected transparent conductive layer 15a is formed inside the hole 15p. At this time, the drain connected transparent conductive layer 15a contacts with a part of the surface of the drain electrode 11d inside the hole 12p, while the rest of the surface of the drain electrode 11d is exposed. And then a dielectric layer 17 with a hole 17p is formed on the first transparent conductive layer 15. These holes 12p, 13p and 17p together form the first contact hole CH1. Subsequently, a second transparent conductive layer 19a is formed on the dielectric layer 17 and inside the first contact hole CH1 so as to contact with the rest of the surface of the drain electrode 11d. This process step of forming the contact portion 105(1) will be described in further detail later.

In this embodiment, the drain electrode 11d and the second transparent conductive layer 19a need not directly contact with each other inside the first contact hole CH1.

FIGS. 4(a) and 4(b) are respectively a plan view and a cross-sectional view illustrating another exemplary TFT and contact portion according to this embodiment. FIG. 4(b) illustrates a cross section as viewed on the plane A-A' shown in FIG. 4(a). In FIGS. 4(a) and 4(b), any component also included in the TFT 101 and contact portion 105(1) shown in FIG. 3 and having substantially the same function as its counterpart is identified by the same reference numeral and description thereof will be omitted herein to avoid redundancies.

In this contact portion 105(2), inside the first contact hole CH1, the drain electrode 11d contacts with only the drain connected transparent conductive layer 15a and does not contact with the second transparent conductive layer 19a. That is to say, the drain electrode 11d is electrically connected to the second transparent conductive layer 19a via the drain connected transparent conductive layer 15a. In this example, a portion in which the drain electrode 11d contacts with the drain connected transparent conductive layer 15a becomes the contact portion 105(2). The contact portion 105(2) is arranged so as to overlap with the gate line layer (i.e., either the gate line 3 or the gate electrode 3 in this case) when viewed along a normal to the substrate 1. Furthermore, the hole 17p of the dielectric layer 17 and the holes 12p, 13p of the interlevel insulating layer 14 (i.e., the first and second insulating layers 12 and 13) are arranged so as to partially overlap with each other. Thus, the dielectric layer 17 has been formed so as to cover a portion of the drain connected transparent conductive layer 15a on the side surface of the interlevel insulating layer 14 which faces the hole. The second transparent conductive layer 19a has been formed so as to cover the dielectric layer 17 and a portion of the drain connected transparent conductive layer 15a which is not covered with the dielectric layer 17.

This contact portion 105(2) may be formed in the following manner, for example. First of all, as in the method of forming the contact portion 105(1) described above, the first insulating layer 12 is etched using the second insulating layer 13 as a mask, thereby cutting a hole 12p which exposes the surface of the drain electrode 11d. After that, a first transparent conductive layer 15 with a hole 15p is formed on the second insulating layer 13 and a drain connected transparent conductive layer 15a is formed inside the hole 15p. At this time, the drain connected transparent conductive layer 15a is arranged so as to contact with the entire surface of the drain electrode 11d inside the hole 12p. And then a dielectric layer 17 with a hole 17p is formed on the first transparent conductive layer 15. These holes 12p, 13p and 17p together form the first contact hole CH1. Since a part of the profile of the hole 17p is located inside of the profile of the hole 13p, the dielectric layer 17 is formed so as to cover partially the respective side surfaces of the holes 12p and 13p (i.e., the side surface on the left-hand side in FIG. 4). Subsequently, a second transparent conductive layer 19a is formed on the dielectric layer 17 and inside the first contact hole CH1 so as to contact with the drain connected transparent conductive layer 15a.

Figure 5A:
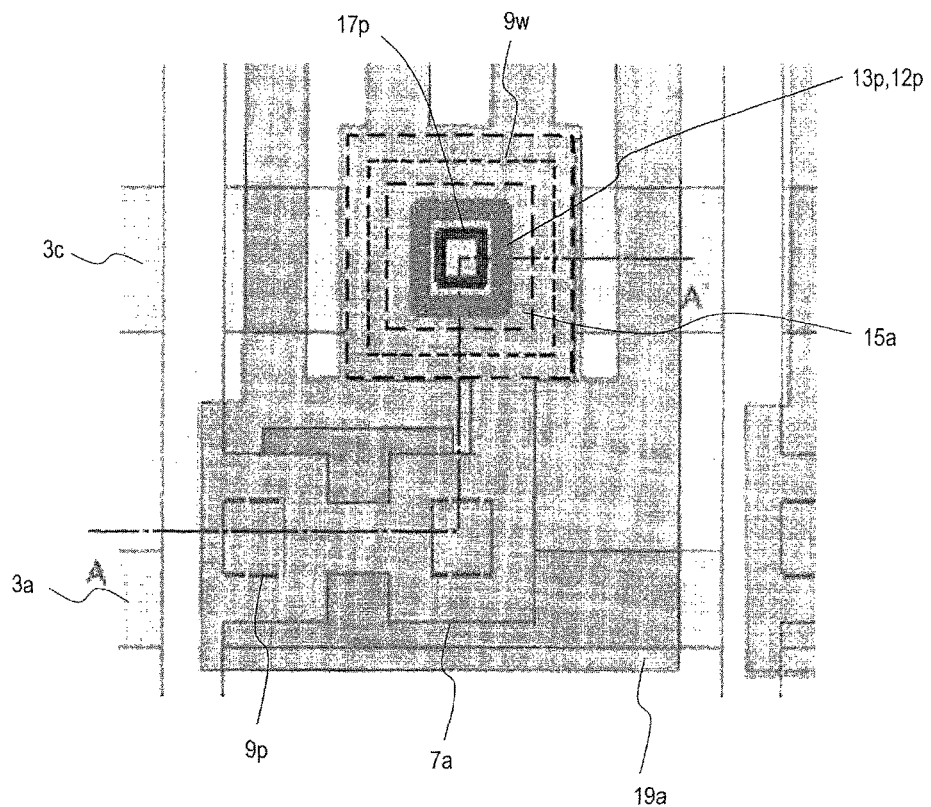
FIG. 5A A plan view illustrating still another exemplary contact portion 105(3) according to the first embodiment of the present invention.
Figure 5B:
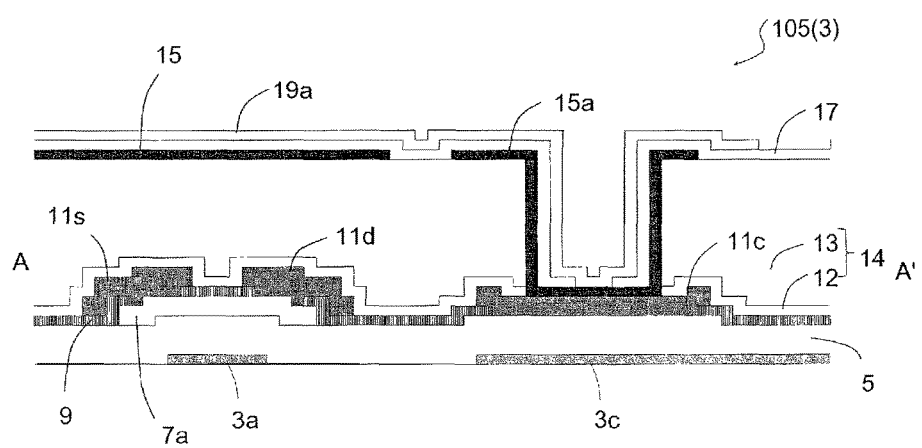
FIG. 5B A cross-sectional view illustrating still another exemplary contact portion 105(3) according to the first embodiment of the present invention.

FIGS. 5A and 5B are respectively a plan view and a cross-sectional view illustrating still another contact portion 105(3) according to this embodiment.

This contact portion 105(3) is arranged over a lower conductive layer 3c which has been formed out of the same conductive film as the gate line 3 and which is electrically isolated from the gate line 3. The lower conductive layer 3c may be a storage capacitor line, for example. Over the lower conductive layer 3c, an upper conductive layer 11c has been formed with a gate insulating layer 5 interposed between them. The upper conductive layer 11c has been formed out of the same conductive film as the source line 11 and is electrically connected to the drain electrode 11d. Optionally, the upper conductive layer 11c and the drain electrode 11d may form respective parts of the same layer. Over the upper conductive layer 11c, an interlevel insulating layer 14 has been formed to have a hole 14p that exposes the upper conductive layer 11c. Inside the hole 14p of the interlevel insulating layer 14, the drain connected transparent conductive layer 15a, the dielectric layer 17 and the second transparent conductive layer 10a have been stacked one upon the other in this order. A hole 17p has been cut through the dielectric layer 17. In this example, the hole 17p is arranged inside the profile of the hole 14p. The second transparent conductive layer 19a contacts with the drain connected transparent conductive layer 15a inside the hole 17p which has been cut through the dielectric layer 17.

As can be seen, in this contact portion 105(3), the second transparent conductive layer 19a that is the pixel electrode is electrically connected to the upper conductive layer 11c via the drain connected transparent conductive layer 15a. This contact portion 105(3) also functions as a storage capacitor, of which the lower and upper electrodes are defined by the lower and upper conductive layers 3c and 11c, respectively.

Since the contact portions 105(1) to 105(3) of this embodiment (which will be simply referred to herein as "contact portions 105b") have such configurations, the following advantages can be achieved according to this embodiment.

(1) Size of the Contact Portion 105 can be Reduced

According to a conventional configuration (such as the configuration disclosed in Patent Document No. 2), a contact portion to connect a drain electrode and a common electrode together and another contact portion to connect the common electrode and a pixel electrode together need to be formed separately, and therefore, the chip area that should be allocated to the contact portions cannot be reduced, which is a problem.

On the other hand, according to this embodiment, the drain electrode 11d and the second transparent conductive layer 19a (pixel electrode) can be electrically connected together inside a single first contact hole CH1, and therefore, the area that should be allocated to the contact hole can be reduced.

In addition, in the contact portions 105(1) and 105(2), the drain connected transparent conductive layer 15a is arranged so as to cover only a part of the side surface of the first contact hole CH1. That is why compared to a configuration in which two transparent conductive layers are stacked one upon the other inside the entire contact hole, respective components can be laid out more efficiently, and the sizes of the first contact hole CH1 and the contact portion 105 can be reduced. Consequently, a TFT substrate of a higher definition is realized. On top of that, since a redundant structure is formed locally by the second transparent conductive layer 19a and the drain electrode 11d inside the first contact hole CH1, the reliability of the contact portion 105 can be increased.

(2) Surface Protection for the Drain Electrode 11d

In forming the contact portions 105(1) to 105(3), the manufacturing process can be advanced to the process step of forming the dielectric layer 17 with the surface of the drain electrode 11d covered either partially or entirely with the drain connected transparent conductive layer 15a. If such a process is adopted, the area of the exposed portion of the drain electrode 11d can be reduced compared to a situation where the dielectric layer 17 is formed with the drain electrode 11d exposed on the entire bottom of the first contact hole CH1. As a result, the process induced damage to be done on the surface of the drain electrode 11d can be reduced. Consequently, a stabilized contact portion 105 with even lower resistance can be formed. Among other things, according to the configurations of the contact portions 105(2) and 105(3), the manufacturing process can be advanced to the process step of forming the dielectric layer 17 with the exposed surface of the drain electrode 11d covered entirely with the drain connected transparent conductive layer 15a. For that reason, the process induced damage to be done on the surface of the drain electrode 11d can be reduced even more effectively.

(3) Transmittance can be Increased by Arranging Contact Portion 105

In the contact portions 105(1) to 105(3), when viewed along a normal to the substrate 1, the contact portion 105 in which the drain electrode 11d of the TFT 101 contacts with either the drain connected transparent conductive layer 15a or the second transparent conductive layer 19a is suitably arranged to overlap with the gate line layer (such as the gate line 3 or the lower conductive layer 3c). As a result, the decrease in aperture ratio due to the presence of the contact portion 105 can be checked and the transmittance can be increased compared to the conventional configuration.

Among other things, if the contact portion 105 overlaps at least partially with either the gate line 3 or the gate electrode 3a as in the contact portions 105(1) and 105(2), a TFT substrate of higher definition can be obtained. More suitably, the contact portion 105 is arranged to overlap entirely with either the gate line 3 or the gate electrode 3a.

As described for the effect (1), according to this embodiment, the area of the contact portion 105 can be reduced, and therefore, the entire contact portion 105 can be arranged to overlap with the gate line 3 without increasing the width of the gate line 3. As a result, the transmittance can be increased more effectively, and the definition can be further increased.

Furthermore, in a region where the contact portion 105 is going to be formed, the width of the drain electrode 11d is suitably set to be sufficiently smaller than the width of the gate line 3 and the entire drain electrode 11d is suitably arranged so as to overlap with the gate line 3. For example, in the plan view shown in FIG. 3(a), the patterns of the gate electrode 3a and drain electrode 11d may be set so that the distance between the respective edges of the gate electrode 3a and drain electrode 11d becomes equal to or greater than 2 µm. As a result, the decrease in transmittance due to the presence of the drain electrode 11d can be checked. In addition, since the variation in Cgd due to misalignment can be minimized, the reliability of the liquid crystal display device can be increased.

(4) Transmittance can be Increased by Transparent Storage Capacitor

According to this embodiment, a storage capacitor line may be provided so that a storage capacitor is formed on the storage capacitor line, but the storage capacitor line itself may be omitted. In that case, the second transparent conductive layer 19a may be arranged so as to overlap at least partially with the first transparent conductive layer 15 with the dielectric layer 17 interposed between them, thereby producing capacitance. This capacitance can function as a storage capacitor. By appropriately adjusting the material and thickness of the dielectric layer 17 and the area of a portion to produce the capacitance, a storage capacitor with any intended capacitance can be obtained. That is why there is no need to form a storage capacitor separately inside a pixel using the same metal film as the source line, for example, which is advantageous. As a result, the decrease in aperture ratio due to the presence of a storage capacitor using a metal film can be checked.

In this embodiment, the semiconductor layer 7a for use as the active layer of the TFT 101 is not particularly limited but may be an oxide semiconductor layer, for example. The oxide semiconductor layer may include an In—Ga—Zn—O based semiconductor (which will be referred to herein as an "IGZO based semiconductor"), for example. In this case, the IGZO based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The IGZO based semiconductor may be either amorphous or crystalline. If the IGZO based semiconductor is a crystalline one, a crystalline IGZO based semiconductor of which the c axis is substantially perpendicular to the layer plane is suitably used. The crystal structure of such an IGZO based semiconductor is disclosed, for example, in Japanese Laid-Open Patent Publication No. 2012-134475, the entire disclosure of which is hereby incorporated by reference. Since an oxide semiconductor has higher mobility than an amorphous silicon semiconductor, the size of the TFT 101 can be reduced. On top of that, if an oxide semiconductor TFT is applied to the semiconductor device of this embodiment, the following advantages can also be achieved.

As described above, the contact portion 105 is suitably arranged so as to overlap with the gate line 3 to increase the aperture ratio of each pixel. Then, Cgd increases compared to the conventional configuration. The semiconductor device is ordinarily designed so that the ratio of Cgd to the pixel capacitance $Cgd/[Cgd+(C_{LC}+C_{CS})]$ is less than a predetermined value. For that reason, as Cgd increases, the pixel capacitance $(C_{LC}+C_{CS})$ should also be increased accordingly. However, even if the pixel capacitance can be increased, an amorphous silicon TFT could not write at a conventional frame frequency. As can be seen, for a conventional semiconductor device using an amorphous silicon TFT, it is not practical to adopt a configuration in which the contact portion is arranged to overlap with the gate line, and such a configuration has never been adopted, because other characteristics that a display device needs to have would not be satisfied with such a configuration.

On the other hand, according to this embodiment, $C_{CS}$ can be increased by using a storage capacitor which is formed by the first and second transparent conductive layers 15 and 19a and dielectric layer 17 described above. Since both of these conductive layers 15 and 19a are transparent, the transmittance would not decrease even if such a storage capacitor is formed. Consequently, the pixel capacitance can be increased and the ratio of Cgd to the pixel capacitance can be reduced to a sufficiently low level. Furthermore, by applying an oxide semiconductor TFT to this embodiment, even if the pixel capacitance increases, the mobility of the oxide semiconductor is so high that a write operation can be performed at as high a frame frequency as a conventional one. As a result, the aperture ratio can be increased to a degree corresponding to the area of the contact portion 105 with a sufficiently high writing speed maintained and with $Cgd/[Cgd+(C_{LC}+C_{CS})]$ reduced to a sufficiently low level.

If the semiconductor device 100 of this embodiment is applied to an FFS mode display device, then the second transparent conductive layer 19a is divided into multiple portions for respective pixels, which function as pixel electrodes. Each of those portions (pixel electrodes) of the second transparent conductive layer 19a suitably has a plurality of slit holes. On the other hand, as long as the first transparent conductive layer 15 is arranged under the slit holes of the pixel electrodes to say the least, the first transparent conductive layer 15 functions as a counter electrode for the pixel electrodes and can apply a lateral electric field to liquid crystal molecules. The first transparent conductive layer 15 is suitably formed so as to cover almost entirely a portion of each pixel which is not hidden behind a metal film such as the gate line 3 or the source line 11 and which transmits the incoming light. In this embodiment, the first transparent conductive layer 15 covers almost the entire pixel (except the hole 15p to define the contact portion 105). As a result, a portion of the first transparent conductive layer 15 which overlaps with the second transparent conductive layer 19a can be increased, and therefore, the area of the storage capacitor can be increased. In addition, if the first transparent conductive layer 15 covers almost the entire pixel, an electric field coming from an electrode (or line) which is located under the first transparent conductive layer 15 can be cut off by the first transparent conductive layer 15, which is also advantageous. 80% or more of each pixel is suitably covered with the first transparent conductive layer 15, for example.

The semiconductor device 100 of this embodiment is applicable to a display device which operates in any mode other than the FFS mode. For example, to apply the semiconductor device 100 of this embodiment to a longitudinal electric field driven display device such as a VA mode display device so that the second transparent conductive layer 19a functions as a pixel electrode and that a transparent storage capacitor is formed in each pixel, the dielectric layer 17 and the first transparent conductive layer 15 may be formed between the pixel electrodes and the TFTs 101.

<S-G Connecting Portion Forming Region 103R>

Figure 6A:
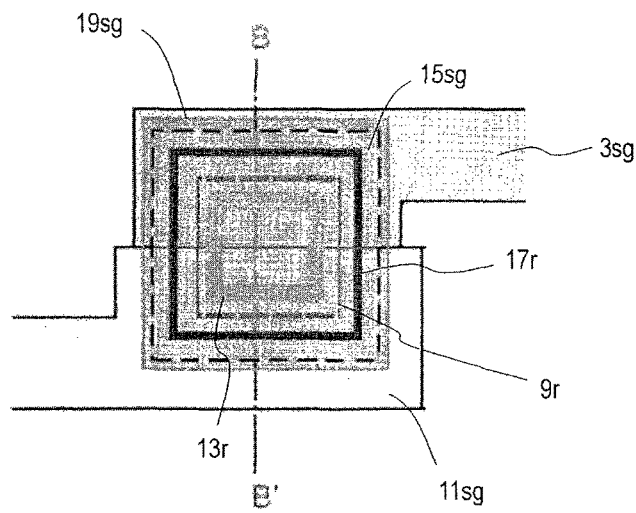
FIG. 6A A plan view illustrating a portion of an S-G connecting portion forming region 103R according to the first embodiment of the present invention.
Figure 6B:
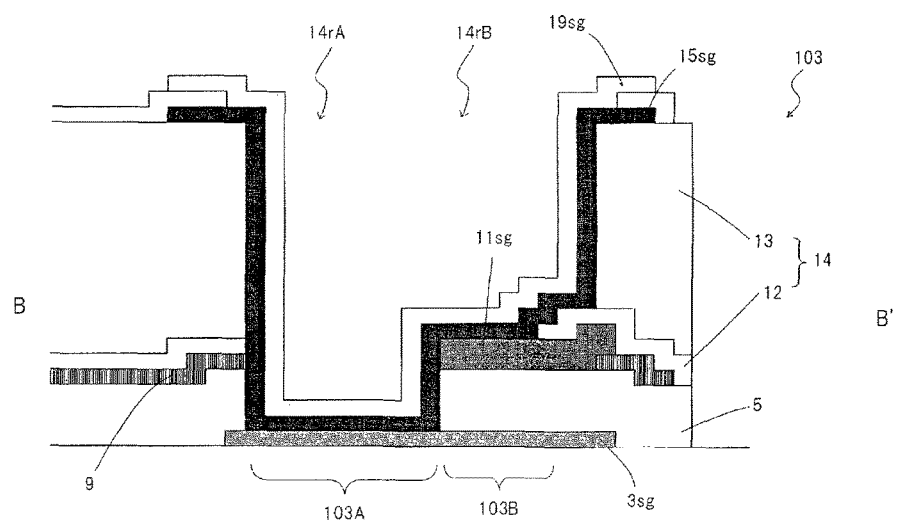
FIG. 6B A cross-sectional view illustrating a portion of the S-G connecting portion forming region 103R according to the first embodiment of the present invention.

FIGS. 6A and 6B are respectively a plan view and a cross-sectional view illustrating a portion of an S-G connecting portion forming region 103R according to this embodiment.

In each S-G connecting portion 103 to be formed in the S-G connecting portion forming region 103R, a lower conductive layer 3sg which has been formed out of the same conductive film as the gate line 3 and an upper conductive layer 11sg which has been formed out of the same conductive film as the source line 11 are connected together via a lower transparent conductive layer 15sg. In the example illustrated in FIG. 6, the S-G connecting portion 103 includes: a first connecting portion 103A to connect the lower conductive layer 3sg and the lower transparent conductive layer 15sg together; and a second connecting portion 103B to connect the upper conductive layer 11sg and the lower transparent conductive layer 15sg together. The lower transparent conductive layer 15sg may have been formed out of the same conductive film as the first transparent conductive layer 15, for example.

The first connecting portion 103A includes: the lower conductive layer 3sg; the gate insulating layer 5, protective layer 9 and interlevel insulating layer 14 which have been extended so as to cover the lower conductive layer 3sg; a lower transparent conductive layer 15sg which contacts with the lower conductive layer 3sg inside a hole 14rA that has been cut through the gate insulating layer 5, protective layer 9 and interlevel insulating layer 14; and an upper transparent conductive layer 19sg which has been formed on the lower transparent conductive layer 15sg inside the hole 14rA. The upper transparent conductive layer 19sg may have been formed out of the same conductive film as the second transparent conductive layer (pixel electrode) 19a, for example.

On the other hand, the second connecting portion 103B includes: the upper conductive layer 11sg which has been formed on the gate insulating layer 5; the interlevel insulating layer 14 which has been extended so as to cover the upper conductive layer 11sg; the lower transparent conductive layer 15sg which contacts with the upper conductive layer 11sg inside a hole 14rB that has been cut through the interlevel insulating layer 14; and the upper transparent conductive layer 19sg which has been formed on the lower transparent conductive layer 15sg inside the hole 14rB.

In the example illustrated in FIG. 6, the holes 14rA and 14rB of the first and second connecting portions 103A and 103B are supposed to form a single continuous hole. However, these holes 14rA and 14rB may also be two separate holes.

In the S-G connecting portion 103 of this embodiment, in the holes 14rA and 14rB, the lower and upper transparent conductive layers 15sg and 19sg are stacked one upon the other to form a redundant structure. In this manner, the reliability of the S-G connecting portion 103 can be increased.

In this embodiment, the upper conductive layer 11sg is connected to the source line 11 and the lower conductive layer 3sg is connected to the lower conductive layer 3t of the terminal portion (i.e., source terminal portion) 102. In this manner, the source line 11 can be connected to the terminal portion 102 via the S-G connecting portion 103.

<Configuration for Liquid Crystal Display Device>

Figure 7:
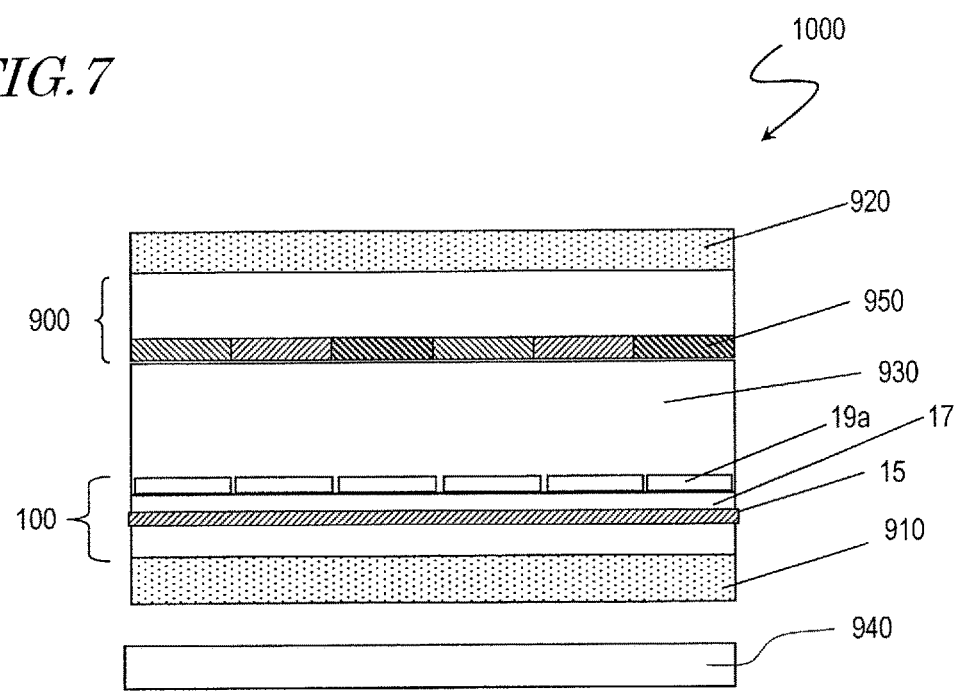
FIG. 7 Illustrates an exemplary liquid crystal display device 1000 according to the first embodiment of the present invention.

Hereinafter, a configuration for a liquid crystal display device that uses the semiconductor device 100 of this embodiment will be described. FIG. 7 illustrates an exemplary liquid crystal display device 1000 according to this embodiment.

As shown in FIG. 7, this liquid crystal display device 1000 includes a liquid crystal layer 930, a TFT substrate 100 (corresponding to the semiconductor device 100 of the first embodiment) and a counter substrate 900 which face each other with the liquid crystal layer 930 interposed between them, two polarizers 910 and 920 which are arranged outside of the TFT substrate 100 and counter substrate 900, respectively, and a backlight unit 940 which emits light for display purposes toward the TFT substrate 100. On the TFT substrate 100, arranged are a scan line driver to drive a plurality of scan lines (gate bus lines) and a signal line driver to drive a plurality of signal lines (data bus lines). The scan line driver and the signal line driver are connected to a controller which is arranged outside of the TFT substrate 100. Under the control by the controller, scan signals to turn ON and OFF the TFTs are supplied from the scan line driver to those scan lines and display signals (i.e., voltages applied to the second transparent conductive layer 19a that are pixel electrodes) are supplied from the signal line driver to those signal lines. Also, as already described with reference to FIG. 1, a COM signal is supplied through a COM signal line to the first transparent conductive layer 15 that is a common electrode.

The counter substrate 900 includes color filters 950, which include R (red), G (green) and B (blue) filters that are arranged for respective pixels when a display operation is supposed to be conducted in the three primary colors.

This liquid crystal display device 1000 conducts a display operation by inducing alignments of liquid crystal molecules in the liquid crystal layer on a pixel-by-pixel basis in response to a potential difference between the first transparent conductive layer 15 that functions as the common electrode of the TFT substrate 100 and the second transparent conductive layer 19a that functions as pixel electrodes.

<Method for Fabricating Semiconductor Device 100>

Hereinafter, an exemplary method for fabricating the semiconductor device 100 of this embodiment will be described with reference to the accompanying drawings.

In the example to be described below, it will be described how to make the TFTs 101 and contact portion 105 shown in FIGS. 5A and 5B, the terminal portions 102(1) shown in FIGS. 2(a) and 2(b), and the S-G connecting portions 103 shown in FIGS. 6A and 6B on the substrate 1 simultaneously. It should be noted that the manufacturing process of this embodiment is not limited to the exemplary one to be described below. Also, the respective configurations of the TFTs 101, contact portions 105, terminal portions 102, and S-G connecting portions 103 are appropriately changeable, too.

FIG. 8 shows the flow of the manufacturing process of the semiconductor device 100 of this embodiment. In this example, a mask is used in each of STEPS 1 through 8, and eight masks are used in total.

Figure 9A:
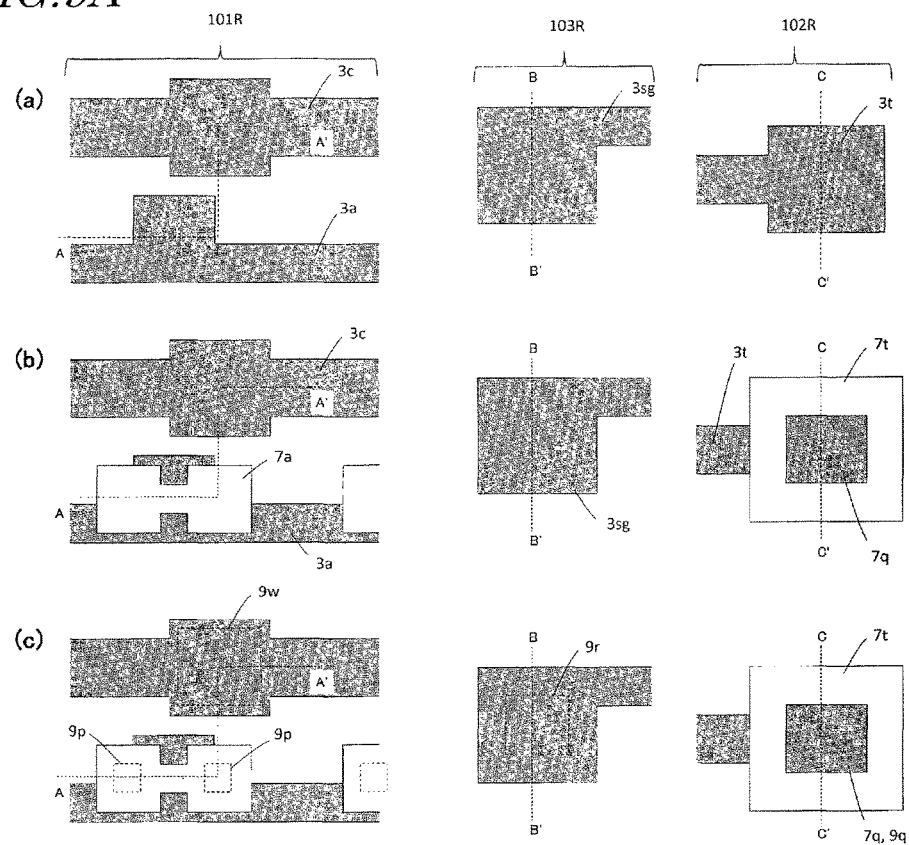
FIG. 9A(a) to (c) are plan views illustrating respective manufacturing process steps to fabricate the semiconductor device according to the first embodiment of the present invention.
Figure 9B:
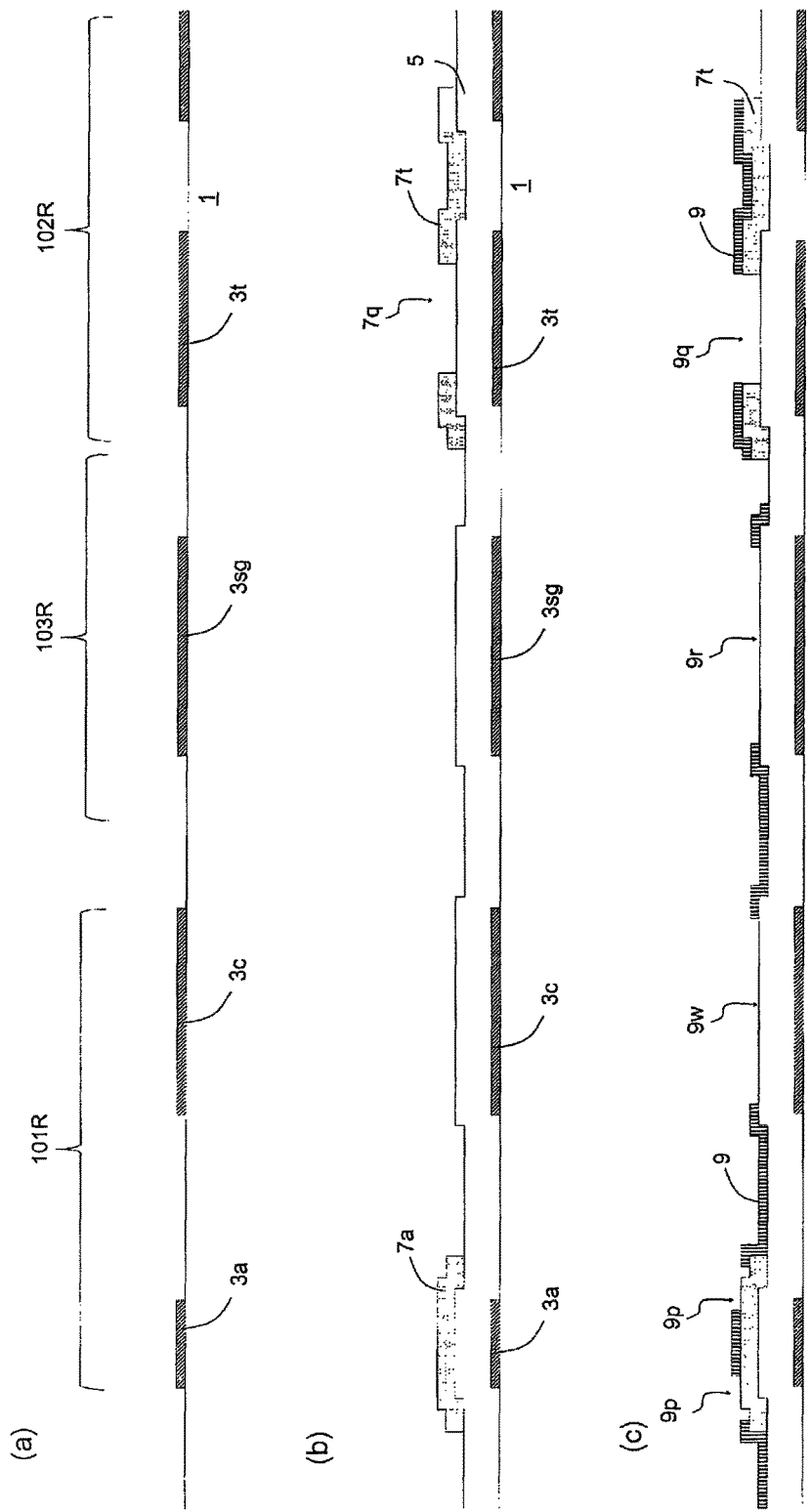
FIG. 9B(a) to (c) are cross-sectional views illustrating respective manufacturing process steps to fabricate the semiconductor device according to the first embodiment of the present invention.
Figure 10A:
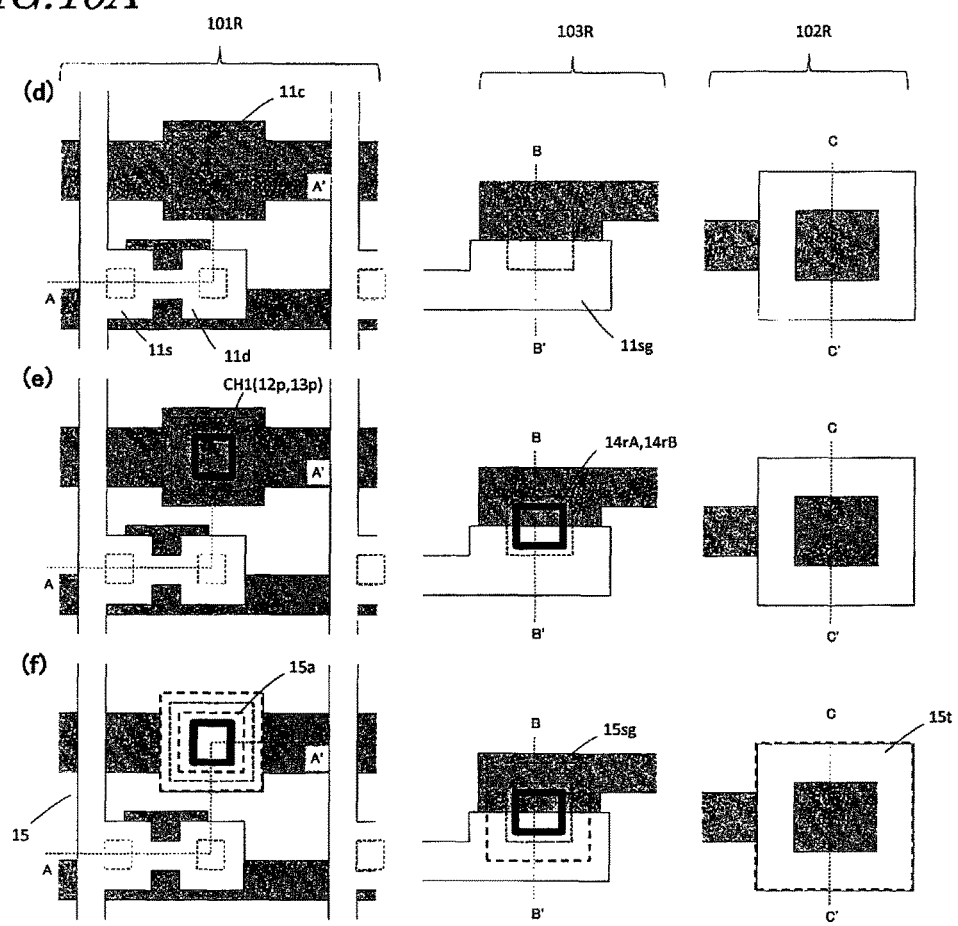
FIG. 10A(d) to (f) are plan views illustrating respective manufacturing process steps to fabricate the semiconductor device according to the first embodiment of the present invention.
Figure 10B:
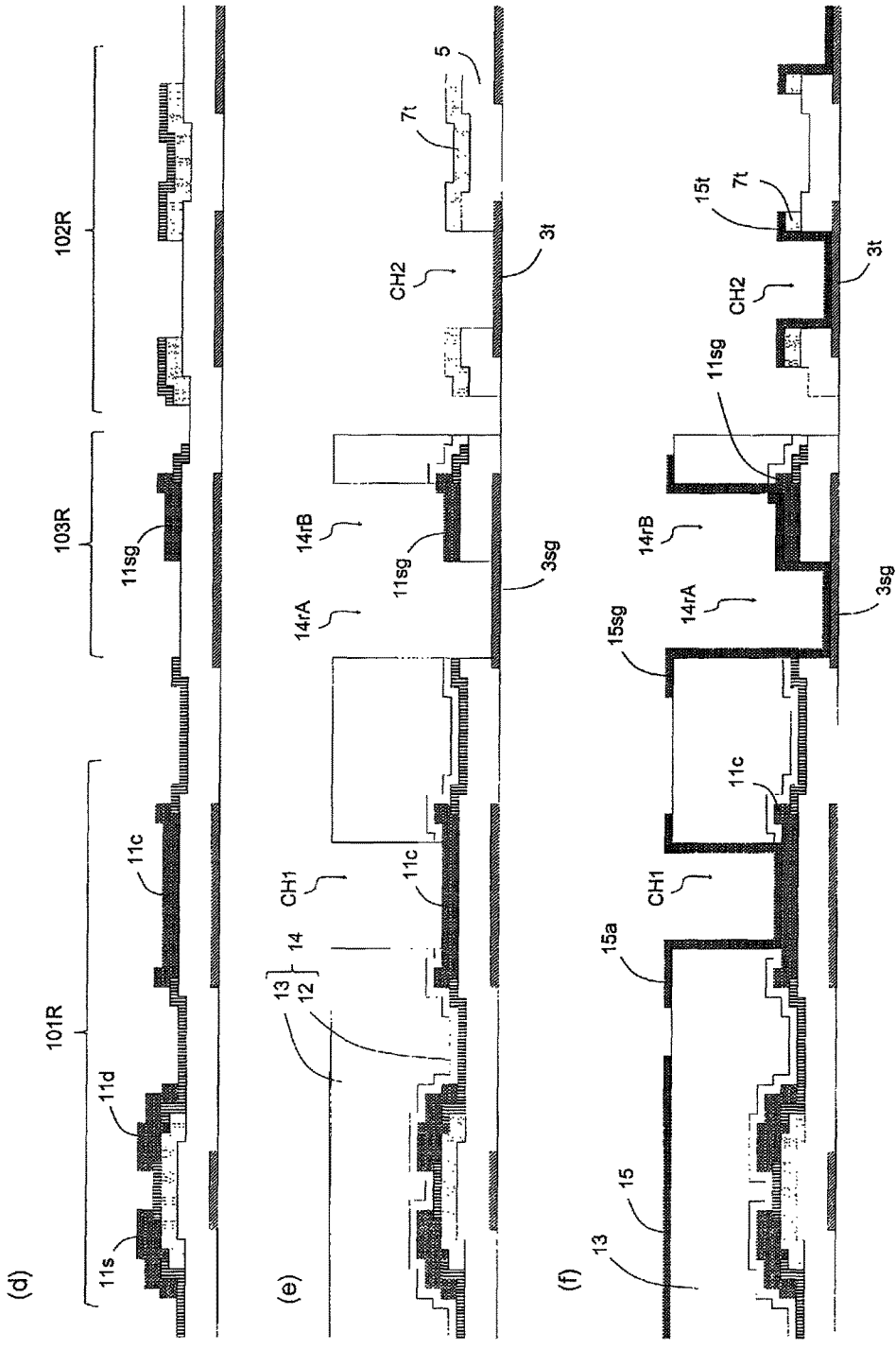
FIG. 10B(d) to (f) are cross-sectional views illustrating respective manufacturing process steps to fabricate the semiconductor device according to the first embodiment of the present invention.
Figure 11A:
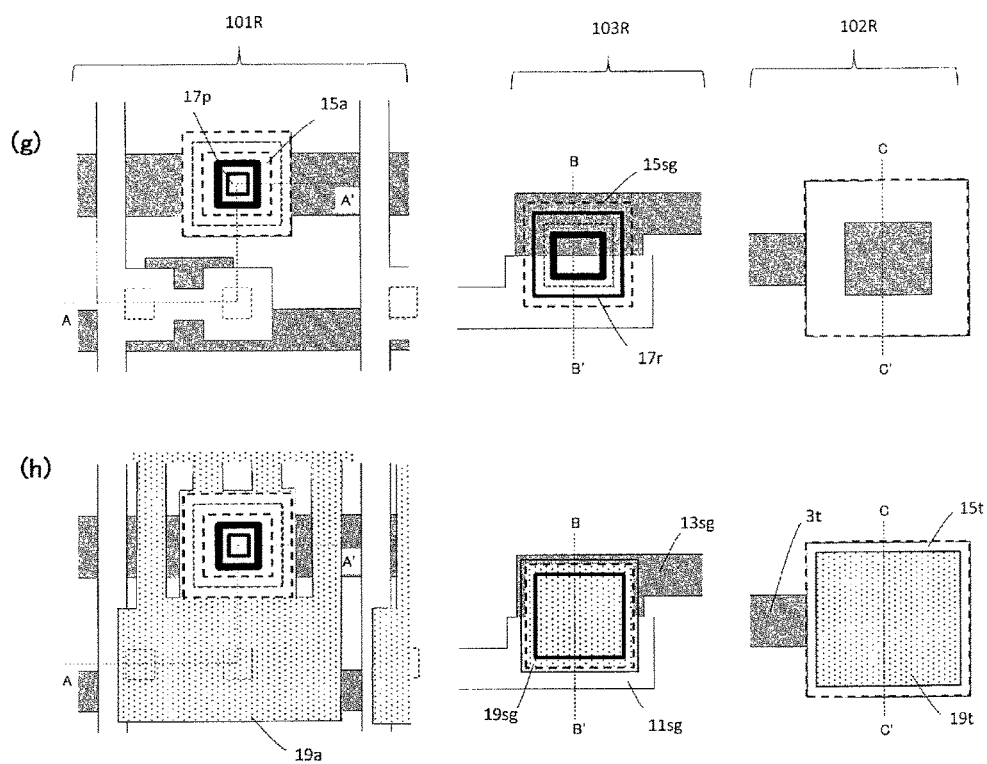
FIG. 11A(g) and (h) are plan views illustrating respective manufacturing process steps to fabricate the semiconductor device according to the first embodiment of the present invention.
Figure 11B:
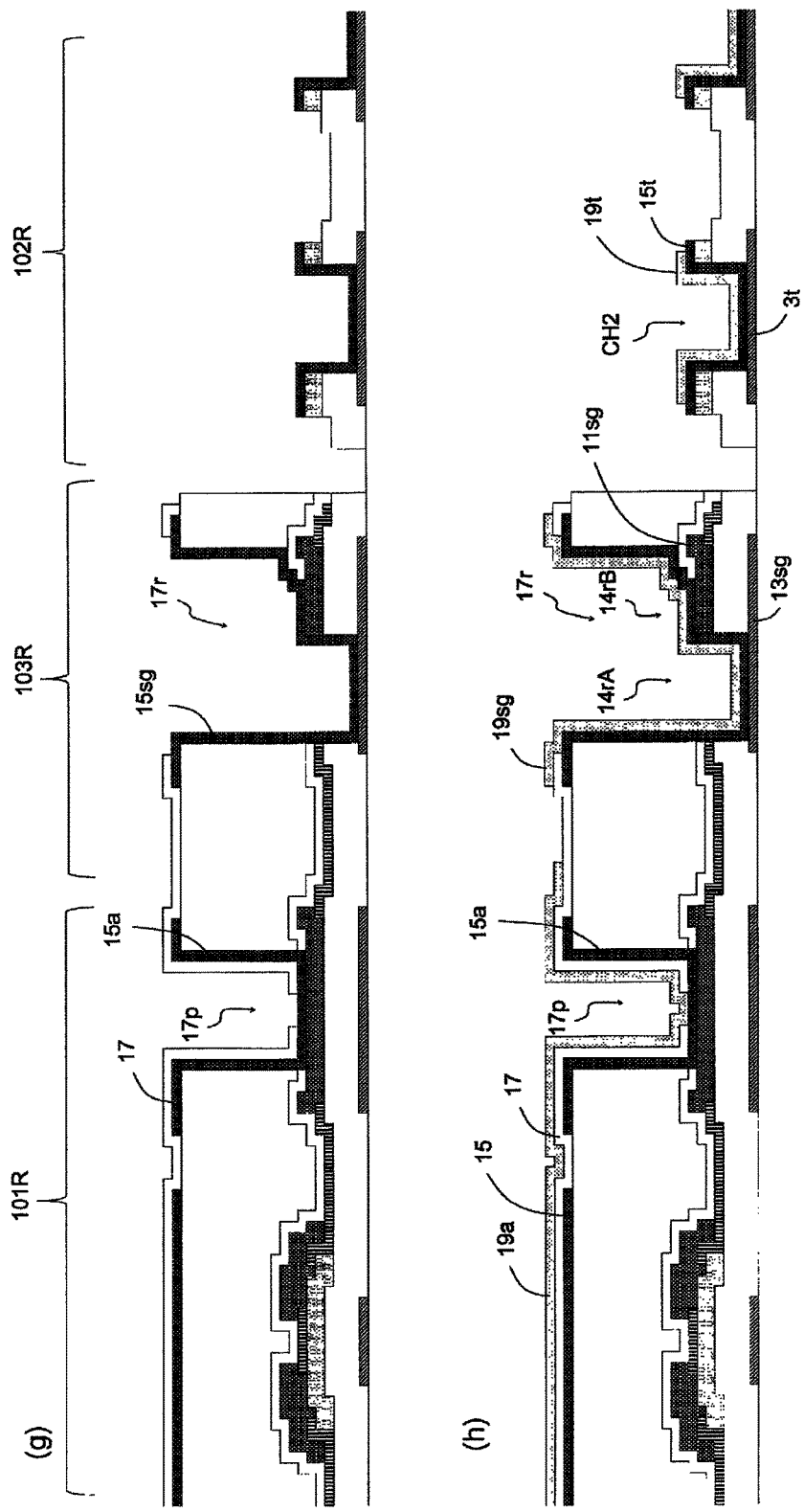
FIGS. 11B(g) and (h) are cross-sectional views illustrating respective manufacturing process steps to fabricate the semiconductor device according to the first embodiment of the present invention.

Portions (a) through (h) of FIGS. 9A, 10A and 11A are plan views illustrating the process step of forming a TFT 101, a contact portion 105, an S-G connecting portion 103 and a terminal portion 102 on the same substrate. Portions (a) through (h) of FIGS. 9B, 10B and 11B are cross-sectional views corresponding to portions (a) through (h) of FIGS. 9A, 10A and 11A.

STEP 1: Gate Line Forming Process Step (Shown in Respective Portions (a) of FIGS. 9A and 9B)

First of all, although not shown, a gate-line-to-be metal film is deposited to a thickness of 50 nm to 500 nm, for example, on the substrate 1. The gate-line-to-be metal film may be deposited on the substrate 1 by sputtering process, for example.

Next, a gate line layer is formed by patterning the gate-line-to-be metal film. In this process step, in the transistor forming region 101R, the gate electrode 3a of the TFT 101 and the lower conductive layer 3c are formed by patterning the gate-line-to-be metal film so that the gate electrode 3a, the lower conductive layer 3c and the gate line form respective parts of the same layer as shown in respective portions (a) of FIGS. 9A and 9B. In the same way, the lower conductive layer 3t of the terminal portion 102 is formed in the terminal portion forming region 102R, and the lower conductive layer 3sg of the S-G connecting portion 103 is formed in the S-G connecting portion forming region 103R.

As the substrate 1, a glass substrate, a silicon substrate, or a plastic substrate (resin substrate) with thermal resistance may be used, for example.

The material of the gate-line-to-be metal film is not particularly limited. But a film of a material appropriately selected from the group consisting of metals aluminum (Al), tungsten (W), molybdenum (Mo), tantalum (Ta), chromium (Cr), titanium (Ti) and copper (Cu), their alloys, and their metal nitrides, or a stack of films of any of these materials, may be used. In this example, a stack of Cu (copper) and Ti (titanium) layers is used. The thicknesses of the upper Cu and the lower Ti layers may be for example 300 nm and 30 nm, respectively. A patterning process is carried out by defining a resist mask (not shown) by known photolithographic process and then removing portions of the gate-line-to-be metal film which are not covered with the resist mask. After the patterning process is done, the resist mask will be removed.

STEP 2: Gate Insulating Layer and Semiconductor Layer Forming Process Step (Shown in Respective Portions (b) of FIGS. 9A and 9B)

Next, as shown in respective portions (b) of FIGS. 9A and 9B, a gate insulating layer 5 is formed over the substrate 1 so as to cover the gate electrode 3a and the lower conductive layers 3c, 3t and 3sg. Thereafter, by stacking a semiconductor film on the gate insulating layer 5 and patterning the semiconductor film, a semiconductor layer 7a is formed in the transistor forming region 101R and a semiconductor layer 7t is formed in the terminal portion forming region 102R. The semiconductor layer 7a is arranged so as to overlap at least partially with the gate electrode 3a. Meanwhile, the semiconductor layer 7t has a hole 7q over the lower conductive layer 3t. When viewed along a normal to the substrate 1, the hole 7q of the semiconductor layer 7t is suitably located inside the profile of the lower conductive layer 3t. As shown in FIGS. 9A and 9B, the semiconductor film may be removed in the S-G connecting portion forming region 103R.

As the gate insulating layer 5, a silicon oxide (SiOx) layer, a silicon nitride (SiNx) layer, a silicon oxynitride (SiOxNy where x>y) layer, or a silicon nitride oxide (SiNxOy where x>y) layer may be used appropriately. The gate insulating layer 5 may either be a single layer or have a multilayer structure. For example, a silicon nitride layer, a silicon nitride oxide layer or any other suitable layer may be formed as the lower layer on the substrate to prevent dopants from diffusing from the substrate 1, and a silicon oxide layer, a silicon oxynitride layer or any other suitable layer may be formed thereon as the upper layer to ensure electrical insulation. In this example, a gate insulating layer 5 with a double layer structure is formed. The lower layer of the gate insulating layer 5 may be an SiNx film with a thickness of 300 nm, for example, and the upper layer of the gate insulating layer 5 may be an $SiO_2$ film with a thickness of 50 nm, for example. These insulating layers may be formed by CVD process, for example.

It should be noted that if an oxide semiconductor layer is used as the semiconductor layer 7a and if the gate insulating layer 5 is formed to have a multilayer structure, the top layer of the gate insulating layer 5 (i.e., the layer that contacts with the semiconductor layer) is suitably a layer including oxygen (such as an oxide layer like an $SiO_2$ layer). In that case, even if there are oxygen deficiencies in the oxide semiconductor layer, the oxygen deficiencies can be covered by oxygen included in the oxide layer. As a result, such oxygen deficiencies of an oxide semiconductor layer can be reduced effectively.

In this embodiment, an oxide semiconductor layer is formed as the semiconductor layer 7a. For example, an oxide semiconductor film (not shown) is deposited to a thickness of 30 nm to 200 nm on the gate insulating layer 5 by sputtering process. The oxide semiconductor film may be an In—Ga—Zn—O based amorphous oxide semiconductor film including In, Ga and Zn at a ratio of one to one to one (i.e., an IGZO based semiconductor film), for example. In this example, an IGZO based semiconductor film with a thickness of 50 nm, for example, is formed as the oxide semiconductor film. Thereafter, the oxide semiconductor film is patterned by photolithographic process to obtain a semiconductor layer 7a, which is arranged so as to overlap with the gate electrode 3a with the gate insulating layer 5 interposed between them.

In the IGZO based semiconductor film, In, Ga and Zn do not have to have the ratio described above but may also have any other appropriately selected ratio. Alternatively, the semiconductor layer 7a may also be made of another oxide semiconductor film, instead of the IGZO based semiconductor film. Examples of other oxide semiconductor films include $InGaO_3(ZnO)_5$, magnesium zinc oxide ($Mg_xZn_{1-x}O$), cadmium zinc oxide ($Cd_xZn_{1-x}O$) and cadmium oxide (CdO) films.

STEP 3: Protective Layer and Gate Insulating Layer Etching Process Step (Shown in Respective Portions (c) of FIGS. 9A and 9B)

Next, a protective layer 9 is formed to a thickness of 30 nm to 200 nm, for example, on the semiconductor layers 7a, 7t and the gate insulating layer 5. Subsequently, the protective layer 9 is etched through a resist mask (not shown). In this process step, the etching condition is determined according to the materials of the respective layers so that only the protective layer 9 is etched selectively but the semiconductor layers 7a, 7t and the gate insulating layer 5 are not etched. In this case, if a dry etching process is adopted, the etching condition includes the type of the etch gas, the temperature of the substrate 1, and the degree of vacuum in the chamber. On the other hand, if a wet etching process is adopted, then the etching condition includes the type of the etchant and the etching process time.

As a result, in the transistor forming region 101R, a hole 9p is cut through the protective layer 9 to expose portions on right- and left-hand sides of a part of the semiconductor layer 7a to be a channel region as shown in respective portions (c) of FIGS. 9A and 9B. In this etching process step, the semiconductor layer 7a functions as an etch stopper. It should be noted that the protective layer 9 may be patterned so as to cover at least that part to be a channel region. That part of the protective layer 9 to be located over the channel region functions as a channel protective film. With that film, the damage to be done later on the semiconductor layer 7a as a result of the etching process in the source and drain separating process step, for example, can be minimized, and therefore, the deterioration of the TFT characteristic can be reduced.

On the other hand, in the terminal portion forming region 102R, the protective layer 9 is formed so as to cover the upper surface of the semiconductor layer 7t. The protective layer 9 has a hole 9q which is located over the lower conductive layer 3c. In respective portions (c) of FIGS. 9A and 9B, the respective side surfaces of the protective layer 9 and semiconductor layer 7t which face their holes 9q and 7q are illustrated as being aligned with each other. However, the end portion of the protective layer 9 suitably extends farther than (i.e., projects into the hole more deeply than) the end portion of the semiconductor layer 7t. That is to say, when viewed along a normal to the substrate 1, the hole 9q of the protective layer 9 is suitably located inside of the hole 7q of the semiconductor layer 7. In that case, the entire upper surface of the semiconductor layer 7t can be covered with the protective layer 9 more perfectly. As a result, the damage to be done later on the semiconductor layer 7t through an etching process to form source and drain electrodes can be reduced. To protect the semiconductor layer 7t more effectively, the protective layer 9 may cover the side surface of the semiconductor layer 7t, too.

In the region where the contact portion 105 will be formed and in the S-G connecting portion forming region 103R, holes 9w and 9r are cut through the protective layer 9 over the lower conductive layers 3c and 3sg, respectively.

The protective layer 9 may be a silicon oxide film, a silicon nitride film, a silicon oxynitride film or a stack of any of these films. In this example, a silicon dioxide ($SiO_2$) film is deposited as the protective layer 9 to a thickness of 100 nm, for example, by CVD process.

If the protective layer 9 is formed on the semiconductor layers 7a, 7t, the process damage to be done on the oxide semiconductor layer can be reduced. As the protective layer 9, an oxide film such as an SiOx film (including an $SiO_2$ film) is suitably used. In that case, even if there are oxygen deficiencies in the oxide semiconductor layer, the oxygen deficiencies can be covered by oxygen included in the oxide film. As a result, such oxygen deficiencies of an oxide semiconductor layer can be reduced more effectively. In this example, an $SiO_2$ film with a thickness of 100 nm, for example, is used as the protective layer 9.

STEP 4: Source and Drain Forming Process Step (Shown in Respective Portions (d) of FIGS. 10A and 10B)

Next, a source-line-to-be metal film is formed to a thickness of 50 nm to 500 nm, for example, over the protective layer 9 and inside the holes 9p, 9w, 9r and 9q. The source-line-to-be metal film may be formed by sputtering process, for example.

Subsequently, a source line layer is formed by patterning the source-line-to-be metal film. In this process step, source and drain electrodes 11s and 11d and an upper conductive layer 11c are formed out of the source-line-to-be metal film in the transistor forming region 101R as shown in respective portions (d) of FIGS. 10A and 10B. The source and drain electrodes 11s and 11d are connected to the semiconductor layer 7a inside the hole 9p. Meanwhile, the upper conductive layer 11c is formed inside the hole 9w.

In the S-G connecting portion forming region 103R, an upper conductive layer 11sg is formed on a portion of the gate insulating layer 5 which has been exposed through the hole 9r. Another portion of the gate insulating layer 5 which is not covered with the upper conductive layer 11sg remains exposed.

In the terminal portion forming region 102R, the source-line-to-be metal film is removed.

In this etching process step (i.e., the source/drain separating process step), the protective layer 9 covers the semiconductor layers 7a, 7t and functions as a barrier layer, and therefore, the damage to be done on the semiconductor layers 7a, 7t through the etching process can be reduced.

The material of the source-line-to-be metal film is not particularly limited. But a film made of a material selected from the group consisting of metals aluminum (Al), tungsten (W), molybdenum (Mo), tantalum (Ta), copper (Cu), chromium (Cr), and titanium (Ti), their alloys, and their metal nitrides may be used appropriately. In this example, a stack of a lower Ti layer (with a thickness of 30 nm) and an upper Cu layer (with a thickness of 300 nm) is used, for example.

STEP 5: Interlevel Insulating Layer Forming Process Step (Shown in Respective Portions (e) of FIGS. 10A and 10B)

Next, as shown in respective portions (e) of FIGS. 10A and 10B, a first insulating layer 12 and a second insulating layer 13 are deposited in this order on the substrate 1. These insulating layers 12 and 13 together form an interlevel insulating layer 14. In this embodiment, an inorganic insulating layer (passivation film) is formed by CVD process, for example, as the first insulating layer 12. Next, an organic insulating layer, for example, is formed as the second insulating layer 13 on the first insulating layer 12. And then the second insulating layer 13 is patterned, thereby cutting a hole through a portion of the second insulating layer 13 which is located over the upper conductive layer 11c and another hole through a portion of the second insulating layer 13 which is located over the upper and lower conductive layers 11sg and 3sg. Meanwhile, in the terminal portion forming region 102R, the second insulating layer 13 is removed.

Subsequently, using the second insulating layer 13 patterned as a mask, the first insulating layer 12, the gate insulating layer 5 and the protective layer 9 are etched. As a result, in the transistor forming region 101R, a portion of the first insulating layer 12 which is not covered with the second insulating layer 13 is removed. In this manner, a first contact hole CH1 which exposes a portion of the upper conductive layer 11c is cut through the first and second insulating layers 12 and 13.

In the S-G connecting portion forming region 103R, a portion of the first insulating layer 12 which is not covered with the second insulating layer 13 and a portion of the gate insulating layer 5 which is not covered with the upper conductive layer 11sg are removed (by etching the first insulating layer 12 and the gate insulating layer 5 simultaneously). As a result, a hole 14rA which exposes a portion of the lower conductive layer 3sg and a hole 14rB which exposes a portion of the upper conductive layer 11sg are cut through the first and second insulating layers 12 and 13. In this example, these holes 14rA and 14rB are connected together.

In the terminal portion forming region 102R, portions of the protective layer 9 and first insulating layer 12 which are located inside the hole of the semiconductor layer 7t and a portion of the gate insulating layer 5 which is not covered with the semiconductor layer 7t are removed (by etching the first insulating layer 12, gate insulating layer 5 and protective layer 9 simultaneously). That is to say, the semiconductor layer 7t functions as an etch stopper when the protective layer 9 is etched and also functions as an etching mask when the gate insulating layer 5 is etched. Since the semiconductor layer 7t can be used as an etching mask in this manner, there is no need to provide another mask separately to cut a hole, which is advantageous. As a result of this process step, a hole 5q which exposes a portion of the lower conductive layer 3t is cut through the gate insulating layer 5. These holes 5q and 7q together form a second contact hole CH2. On the sidewall of the second contact hole CH2, the side surface of the semiconductor layer 7t is aligned with the side surface of the gate insulating layer 5.

As the first insulating layer 12, a silicon oxide (SiOx) film, a silicon nitride (SiNx) film, a silicon oxynitride (SiOxNy where x>y) film, or a silicon nitride oxide (SiNxOy where x>y) film may be used appropriately. Optionally, an insulating material of any other film quality may also be used. The second insulating layer 13 is suitably a layer made of an organic material and may be a positive photosensitive resin film, for example. In this embodiment, an $SiO_2$ film with a thickness of 200 nm, for example, and a positive photosensitive resin film with a thickness of 2000 nm, for example, are used as the first and second insulating layers 12 and 13, respectively.

It should be noted that the insulating layers 12 and 13 do not always have to be made of these materials. Rather, the materials and etching conditions of these insulating layers 12 and 13 may be selected so that when the second insulating layer 13 is patterned, the second insulating layer 13 can be etched without etching the first insulating layer 12. Therefore, the second insulating layer 13 may be an inorganic insulating layer, for example. Also, in the process step of etching the first insulating layer 12, gate insulating layer 5 and protective layer 9, the materials and etching conditions may be selected so that these layers can be etched but the semiconductor layer 7t and upper conductive layer 11sg are not etched.

STEP 6: First Transparent Conductive Layer Forming Process Step (Shown in Respective Portions (f) of FIGS. 10A and 10B)

Next, a transparent conductive film (not shown) is deposited on the second insulating layer 13, inside the contact holes CH1 and CH2 and inside the holes 14rA and 14rB by sputtering process, for example, and then patterned by known photolithographic process, for instance.

As shown in respective portions (f) of FIGS. 10A and 10B, in the transistor forming region 101R, a first transparent conductive layer 15 is formed on the second insulating layer 13 by patterning the transparent conductive film. Also, a drain connected transparent conductive layer 15a which is electrically isolated from the first transparent conductive layer 15 is formed inside the first contact hole CH1, in which the drain connected transparent conductive layer 15a contacts with the upper conductive layer 11c. An end portion of the drain connected transparent conductive layer 15a may be located on the second insulating layer 13.

In the S-G connecting portion forming region 103R, a lower transparent conductive layer 15sg is formed inside the holes 14rA and 14rB by patterning the transparent conductive film. The lower transparent conductive layer 15sg contacts with the lower conductive layer 3sg inside the hole 14rA and also contacts with the upper conductive layer 11sg inside the hole 14rB. An end portion of the lower transparent conductive layer 15sg may be located on the second insulating layer 13.

In the terminal portion forming region 102R, a lower transparent connecting layer 15t is formed inside the second contact hole CH2 and on a portion of the semiconductor layer 7t by patterning the transparent conductive film. The lower transparent connecting layer 15t contacts with the lower conductive layer 3t inside the second contact hole CH2.

According to this embodiment, while the lower transparent connecting layer 15t is patterned, the semiconductor layer 7t is also patterned simultaneously. If portions of the semiconductor layer 7t which contact with the respective lower transparent connecting layers 15t of adjacent ones of multiple terminal portions being formed on the substrate 1 were connected together, then those terminal portions might be electrically conductive with each other. However, if the semiconductor layer 7t is patterned along with the lower transparent connecting layer 15t as is done in this embodiment, the pattern elements of the semiconductor layer 7t of respective terminal portions can be separated from each other, which is advantageous. If the lower transparent connecting layer 15t and semiconductor layer 7t are patterned by dry etching, the end portion of the lower transparent connecting layer 15t and the end portion of the semiconductor layer 7t (i.e., an end portion opposite from the second contact hole CH2) are aligned with each other when viewed along a normal to the substrate 1. On the other hand, if those layers are patterned by wet etching, then the side surface of that end portion of the semiconductor layer 7t may have an inversely tapered shape which slopes from the end portion of the lower transparent connecting layer 15t toward the second contact hole CH2 in a cross section which intersects with the substrate 1 at right angles. As can be seen, if the lower transparent connecting layer 15t and the semiconductor layer 7t are patterned simultaneously, the semiconductor layer 7t can be left between the lower transparent connecting layer 15t and the gate insulating layer 5 only around the second contact hole CH2 (i.e., in a fringe portion) without increasing the number of manufacturing process steps. Consequently, it is possible to prevent those terminal portions from getting electrically conductive with each other unintentionally while ensuring reliability for those terminal portions.

Optionally, the first transparent conductive layer 15 may be formed so as to cover each pixel almost entirely but the contact portion 105.

As the transparent conductive film to make the first transparent conductive layer 15, the drain connected transparent conductive layer 15a, the lower transparent conductive layer 15sg and the lower transparent connecting layer 15t, an ITO (indium tin oxide) film (with a thickness of 50 nm to 200 nm), an IZO film or a ZnO (zinc oxide) film may be used, for example. In this example, an ITO film with a thickness of 100 nm, for example, is used as the transparent conductive film.

STEP 7: Dielectric Layer Forming Process Step (Shown in Respective Portions (g) of FIGS. 11A and 11B)

Next, a dielectric layer 17 is deposited over the entire surface of the substrate 1 by CVD process, for example. Subsequently, a resist mask (not shown) is formed on the dielectric layer 17 to etch the dielectric layer 17.

As a result, as shown in respective portions (g) of FIGS. 11A and 11B, in the transistor forming region 101R, a hole which exposes the drain connected transparent conductive layer 15a is cut through the dielectric layer 17. Although the hole 17p is arranged in this example to expose the drain connected transparent conductive layer 15a partially at the bottom of the first contact hole CH1, the location of the hole 17p is not particularly limited.

In the S-G connecting portion forming region 103R, a hole 17r which exposes the lower transparent conductive layer 15sg is cut through the dielectric layer 17. In this example, the hole 17r has been cut so that portions of the lower transparent conductive layer 15sg which are located inside the holes 14rA and 14rB are exposed entirely.

In the terminal portion forming region 102R, the dielectric layer 17 is removed.

The material of the dielectric layer 17 is not particularly limited. But as the dielectric layer 17, a silicon oxide (SiOx) film, a silicon nitride (SiNx) film, a silicon oxynitride (SiOxNy where x>y) film, or a silicon nitride oxide (SiNxOy where x>y) film may be used appropriately, for example. Since the dielectric layer 17 is used as a capacitive insulating film to form a storage capacitor in this embodiment, the material and thickness of the dielectric layer 17 are suitably selected appropriately so as to obtain a predetermined capacitance $C_{cs}$. As the material of the dielectric layer 17, SiNx is suitably used in view of its dielectric constant and electrical insulating property. The dielectric layer 17 may have a thickness of 150 nm to 400 nm, for example. If the dielectric layer 17 has a thickness of at least 150 nm, electrical insulation can be achieved with more certainty. On the other hand, if the dielectric layer 17 has a thickness of 400 nm or less, then the predetermined capacitance can be obtained with more certainty. In this embodiment, an SiNx film with a thickness of 300 nm, for example, is used as the dielectric layer 17.

STEP 8: Second Transparent Conductive Layer Forming Process Step (Shown in Respective Portions (h) of FIGS. 11A and 11B)

Subsequently, a transparent conductive film (not shown) is deposited by sputtering process, for example, over the dielectric layer 17, inside the holes 17p and 17r and inside the second contact hole CH2 and then patterned by known photolithographic process, for example.

As a result, as shown in respective portions (h) of FIGS. 11A and 11B, a second transparent conductive layer 19a is formed in the transistor forming region 101R. The second transparent conductive layer 19a contacts with the drain connected transparent conductive layer 15a inside the hole 17p. In this manner, the second transparent conductive layer 19a and the drain electrode 11d can be electrically connected together via the drain connected transparent conductive layer 15a and the upper conductive layer 11c. Also, at least a part of the second transparent conductive layer 19a is arranged so as to overlap with the first transparent conductive layer 15 with the dielectric layer 17 interposed between them. In this embodiment, the second transparent conductive layer 19a functions as a pixel electrode in an FFS mode display device. In that case, a plurality of slits may be cut in each pixel through a portion of the second transparent conductive layer 19a which does not overlap with the gate line 3.

In the S-G connecting portion forming region 103R, an upper transparent conductive layer 19sg which contacts with the lower transparent conductive layer 15sg in the hole 17r is formed out of the transparent conductive film. As a result, the lower and upper conductive layers 3sg and 11sg can be connected together via the lower and upper transparent conductive layers 15sg and 19sg. In addition, since a redundant structure can be obtained by stacking the lower and upper transparent conductive layers 15sg and 19sg one upon the other inside the holes 14rA and 14rB, highly reliable connecting portions are realized.

In the terminal portion forming region 102R, an upper transparent connecting layer 19t for the terminal portion 102 is formed out of the transparent conductive film. The upper transparent connecting layer 19t contacts with the lower transparent connecting layer 15t inside the second contact hole CH2. In this manner, the lower conductive layer 3t and the upper transparent connecting layer 19t can be connected together via the lower transparent connecting layer 15t. In addition, since a redundant structure can be obtained by stacking the lower transparent connecting layer 15t and the upper transparent connecting layer 19t one upon the other, highly reliable terminal portions are realized.

As the transparent conductive film to make the second transparent conductive layer 19a and the upper transparent connecting layers 19sg and 19t, an ITO (indium tin oxide) film (with a thickness of 50 nm to 150 nm), an IZO film or a ZnO (zinc oxide) film, for example, may be used. In this example, an ITO film with a thickness of 100 nm, for example, is used as the transparent conductive film.

Although the protective layer is provided in this embodiment between the gate insulating layer 5 and the interlevel insulating layer 14 in almost the entire display area, the protective layer is removed in the terminal portion forming region 102R. In the process step of forming the terminal portions, however, a protective layer is used to minimize the process damage to be done on the semiconductor layer 7t.

Figure 4:
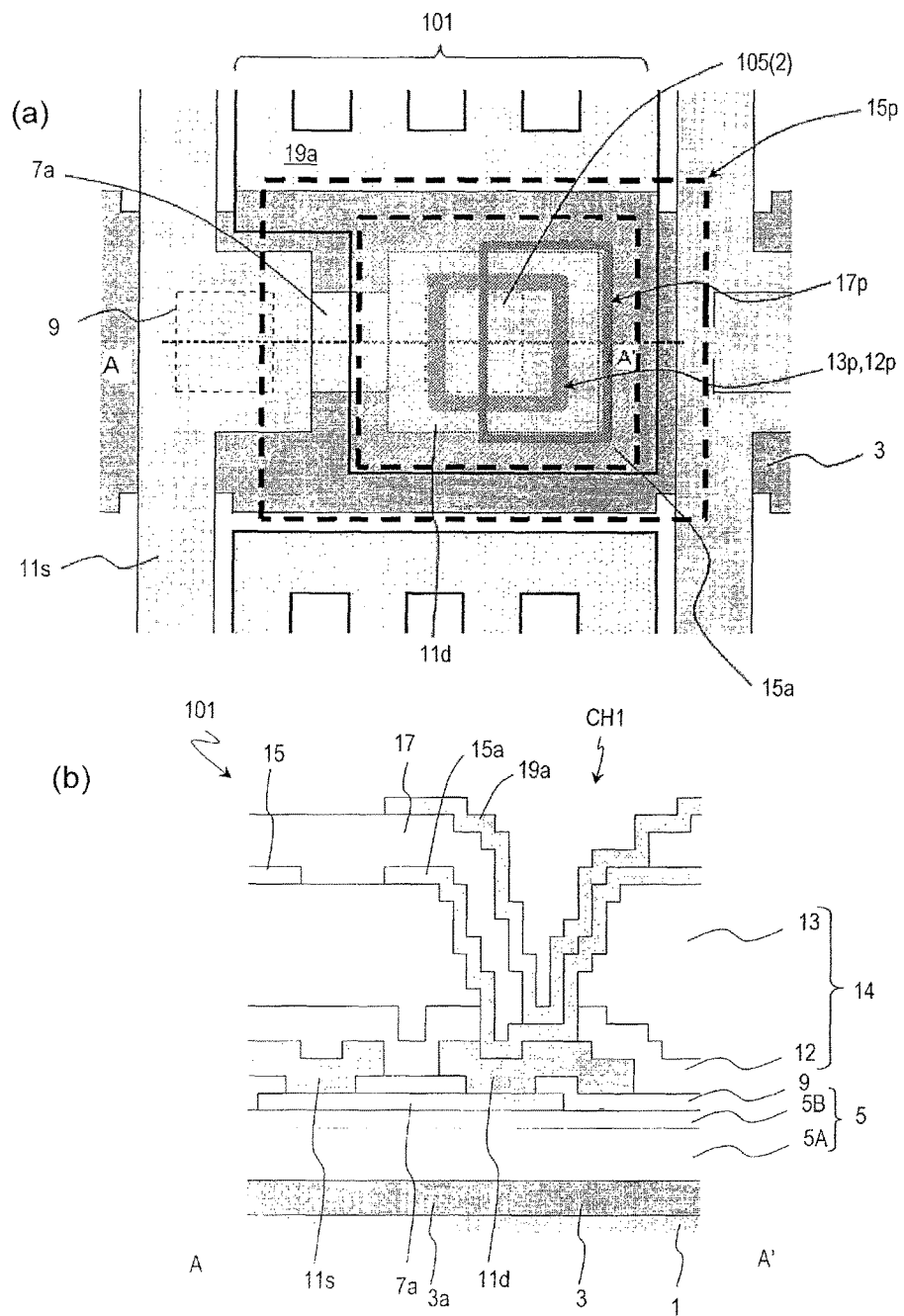
FIGS. 4(a) and (b) are respectively a plan view and a cross-sectional view illustrating another exemplary contact portion 105(2) according to the first embodiment of the present invention.

In the foregoing description, it has been described how to make the terminal portion 102 shown in FIG. 2(b) and the TFT 101 and contact portion 105(3) shown in FIG. 4. However, even when the terminal portion 102(2) shown in FIG. 2(c), the contact portion 105(1) shown in FIG. 3, and the contact portion 105(2) shown in FIG. 4 need to be made instead, those portions can also be made following the flow shown in FIG. 8.

Embodiment 2

Hereinafter, a second embodiment of a semiconductor device according to the present invention will be described.

In the first embodiment described above, in the S-G connecting portion 103, the upper conductive layer 11sg which has been formed out of the source-line-to-be metal and the lower conductive layer 3sg which has been formed out of the gate-line-to-be metal are electrically connected together via the transparent conductive layers 15 and 19a. In this embodiment, however, a structure in which the upper and lower conductive layers 11sg and 3sg are brought into direct contact with each other is adopted. In addition, in this embodiment, the drain connected transparent conductive layer 15a is not formed in the contact portion 105 to make the second transparent conductive layer 19a and the upper conductive layer 11c contact directly with each other, which is another difference from the first embodiment. The contact portion 105 is provided on the lower conductive layer 3c which functions as a storage capacitor line. Furthermore, when a terminal portion is formed, a hole 7q is cut through the semiconductor layer 7t using the protective layer 9 as an etching mask, which is still another difference from the manufacturing process that has already been described for the first embodiment.

Portions (a) through (p) of FIGS. 12 to 15 are cross-sectional views illustrating an exemplary series of manufacturing process steps to fabricate a semiconductor device according to this embodiment. In FIGS. 12 to 15, any component having substantially the same function as its counterpart shown in FIGS. 9B to 11B is identified by the same reference numeral. In the following description, the same process steps as those of the first embodiment (in terms of the material of each component, how to form a film, how to etch the film, and how thick the film is, for example) will not be described all over again.

Figure 12:
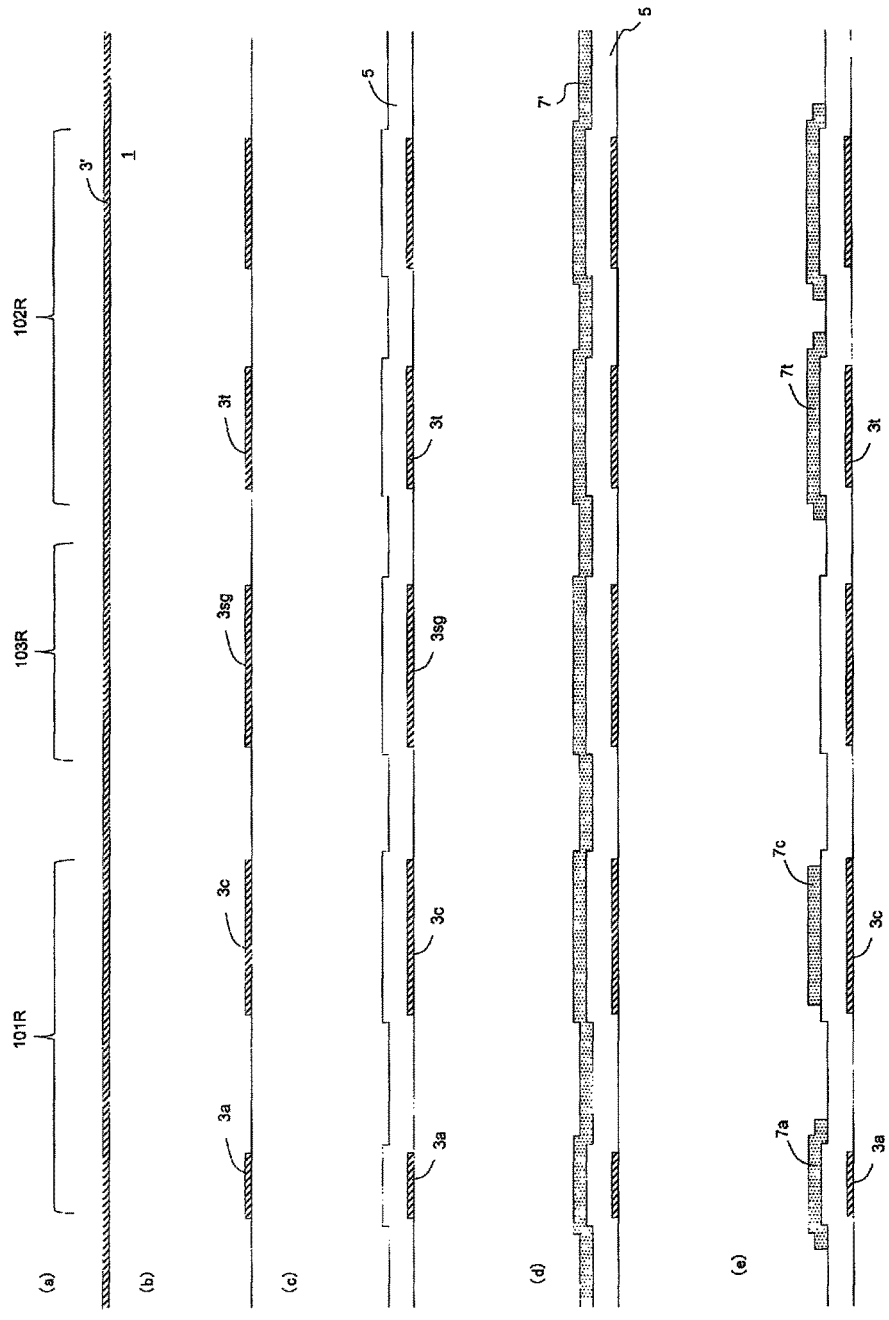
FIG. 12(a) to (e) are cross-sectional views illustrating respective manufacturing process steps to fabricate a semiconductor device according to a second embodiment of the present invention.

First of all, as shown in portion (a) of FIG. 12, a gate-line-to-be metal 3' is deposited on a substrate 1. Next, as shown in portion (b) of FIG. 12, the gate-line-to-be metal 3' is patterned to obtain a gate line layer. Specifically, a gate electrode 3a and a lower conductive layer 3c are formed in the transistor forming region 101R. The lower conductive layer 3c may be a storage capacitor line. Lower conductive layers 3sg and 3t are formed in the S-G connecting portion forming region 103R and in the terminal portion forming region 102R, respectively.

Next, as shown in portion (c) of FIG. 12, a gate insulating layer 5 is formed to cover the gate electrode 3a and the lower conductive layers 3c, 3sg and 3t.

Thereafter, as shown in portion (d) of FIG. 12, a semiconductor film 7' is deposited on the gate insulating layer 5 and then patterned. In this manner, semiconductor layers 7a and 7c are formed in the transistor forming region 101R and a semiconductor layer 7t is formed in the terminal portion forming region 102R as shown in portion (e) of FIG. 12. The semiconductor layer 7a is arranged so as to partially overlap with the gate electrode 3a. The semiconductor layer 7c is arranged to overlap with the lower conductive layer 3c in a region where a contact portion and a storage capacitor will be formed. And the semiconductor layer 7t is arranged so as to partially overlap with the lower conductive layer 3t.

Figure 13:
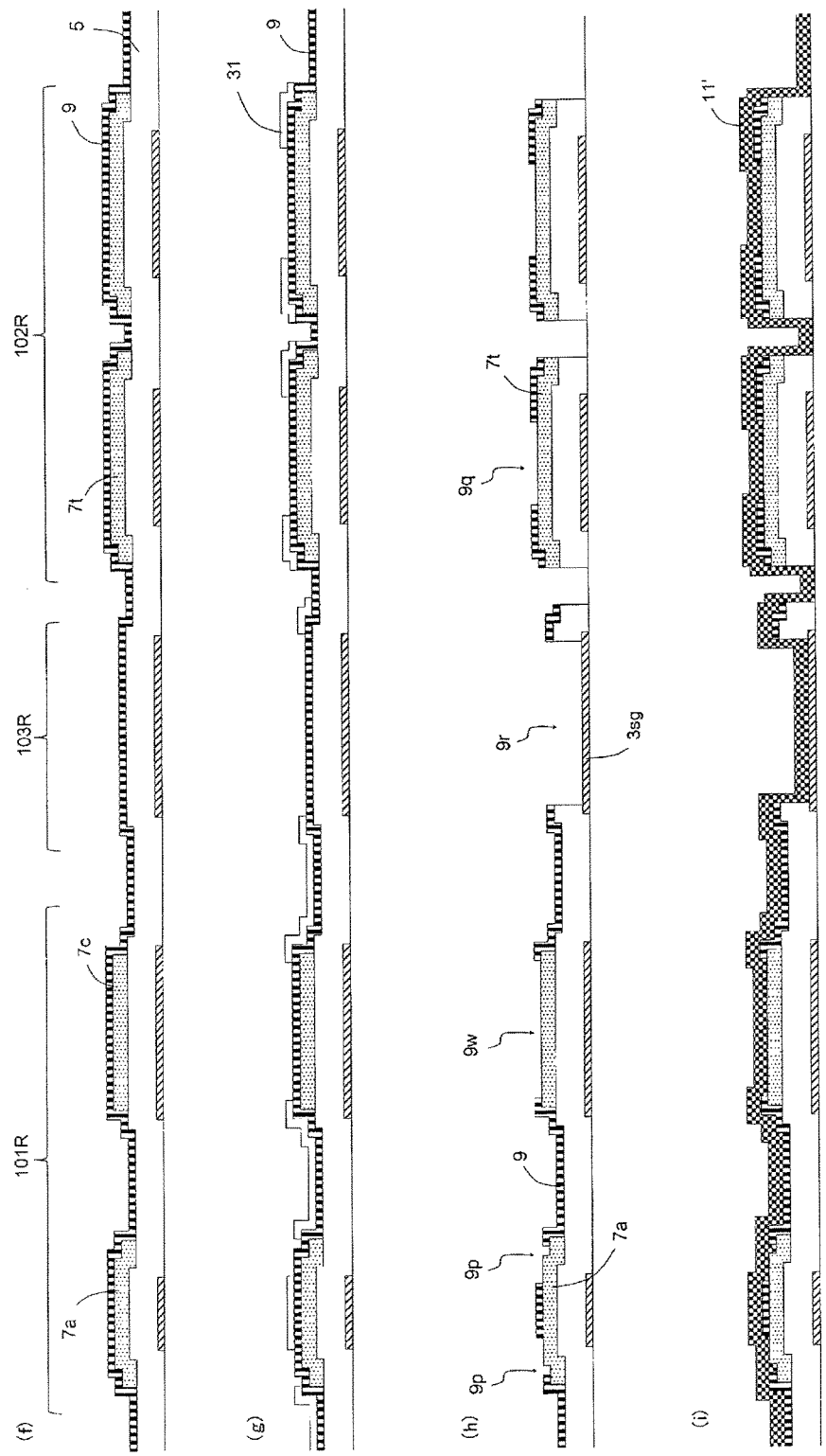
FIG. 13(f) to (i) are cross-sectional views illustrating respective manufacturing process steps to fabricate the semiconductor device according to the second embodiment of the present invention.

Next, as shown in portion (f) of FIG. 13, a protective layer 9 is formed to cover the gate insulating layer 5 and the semiconductor layers 7a, 7c and 7t. Subsequently, as shown in portion (g) of FIG. 13, a mask layer 31 with predetermined holes is formed on the protective layer 9. And using this mask layer 31 as an etching mask, the protective layer 9 is patterned. In this process step, portions of the gate insulating layer 5 which are covered with neither the mask layer 31 nor any of the semiconductor layers 7a, 7c and 7t are also removed (by etching the protective layer 9 and the gate insulating layer 5 simultaneously). As a result, as shown in portion (h) of FIG. 13, in the transistor forming region 101R, a hole 9p which exposes portions of the semiconductor layer 7a on the right- and left-hand sides of its portion to be a channel region is cut through the protective layer 9. In the S-G connecting portion forming region 103R, the protective layer 9 and the gate insulating layer 5 are etched to make a hole 9r which exposes a portion of the lower conductive layer 3sg. And in the terminal portion forming region 102R, a hole 9q is made to expose a portion of the semiconductor layer 7t.

Next, as shown in portion (i) of FIG. 13, a source-line-to-be metal film 11' is deposited over the entire surface of the substrate 1, and then patterned. As a result, as shown in portion (j) of FIG. 14, in the transistor forming region 101R, source and drain electrodes 11s, 11d which contact with the semiconductor layer 7a inside the hole 9p are formed and a TFT 101 is obtained. In addition, an upper conductive layer 11c is formed over the lower conductive layer 3c with the gate insulating layer 5 and the semiconductor layer 7c interposed between them. In the S-G connecting portion forming region 103R, an upper conductive layer 11sg is formed to contact with the lower conductive layer 3sg inside the hole 9r. In this manner, an S-G connecting portion 103(2) is obtained. In the terminal portion forming region 102R, not only the source-line-to-be metal film 11' but also the semiconductor layer 7t are etched as well. In this case, the protective layer 9 functions as an etch stop layer while the source-line-to-be metal film 11' is being etched, and also functions as an etching mask while the semiconductor layer 7t is being etched. Consequently, only a portion of the semiconductor layer 7t which is not covered with the protective layer 9 is removed and its portion covered with the protective layer 9 is left.

Subsequently, as shown in portion (k) of FIG. 14, a first insulating layer 12 is deposited over the entire surface of the substrate 1 and then patterned along with the protective layer 9. In this manner, portions of the first insulating layer 12 and protective layer 9 which are located in the terminal portion forming region 102R are removed. After that, a second insulating layer 13 is formed and then patterned. In this manner, a hole 13p is cut through the second insulating layer 13 over the upper conductive layer 11c and a portion of the second insulating layer 13 which is located in the terminal portion forming region 102R is removed.

Next, a transparent conductive film is deposited over the entire surface of the substrate 1 and then patterned. In this manner, a first transparent conductive layer 15 is formed on the second insulating layer 13 in the transistor forming region 101R and in the S-G connecting portion forming region 103R. The first transparent conductive layer 15 has a hole 15p in its portion to be a contact portion. When viewed along a normal to the substrate 1, the hole 13p of the second insulating layer 13 is located inside of the hole 15p of the first transparent conductive layer 15. Meanwhile, in the terminal portion forming region 102R, when the transparent conductive film is patterned, the semiconductor layer 7t is also etched simultaneously. As a result, a lower transparent connecting layer 15t is formed to contact with the lower conductive layer 3t inside the hole 5q, and the semiconductor layer 7t is divided into multiple portions for respective terminal portions. In each of those terminal portions, the semiconductor layer 7t is located between the lower transparent connecting layer 15t and the gate insulating layer 5, and its end portion opposite from the hole is aligned with the end portion of the lower transparent connecting layer 15t.

Figure 14:
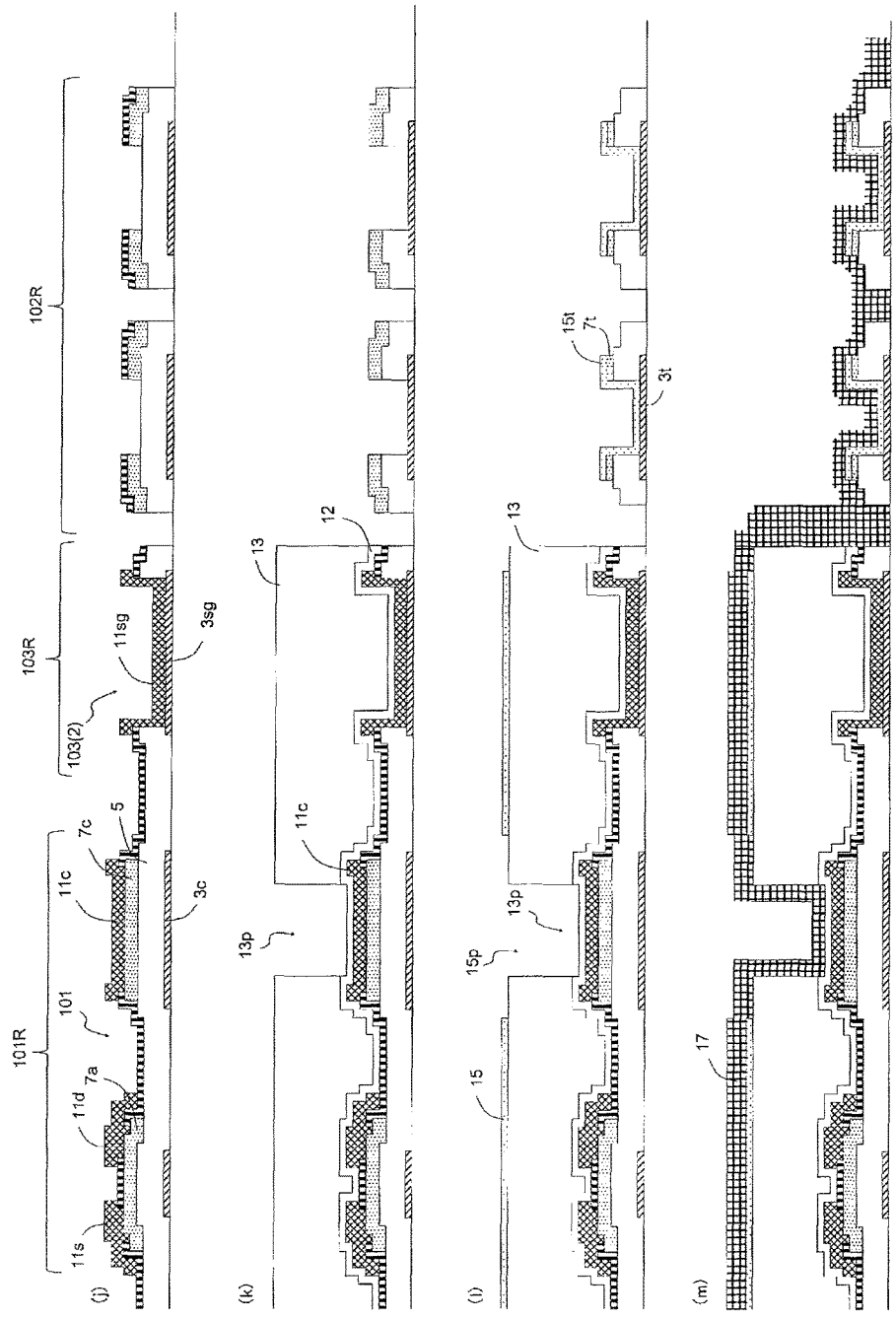
FIG. 14(j) to (m) are cross-sectional views illustrating respective manufacturing process steps to fabricate the semiconductor device according to the second embodiment of the present invention.

Thereafter, as shown in portion (m) of FIG. 14, a dielectric layer 17 is deposited over the entire surface of the substrate 1 (as well as inside the hole 13p), and then patterned. In this manner, a portion of the dielectric layer 17 which is located in the terminal portion forming region 102R is removed as shown in portion (n) of FIG. 15. Also, inside the hole 13p of the second insulating layer 13, a hole 17p which reaches the upper conductive layer 11c is cut through the dielectric layer 17 and the first insulating layer (by etching the dielectric layer 17 and the first insulating layer 12 simultaneously).

Figure 15:
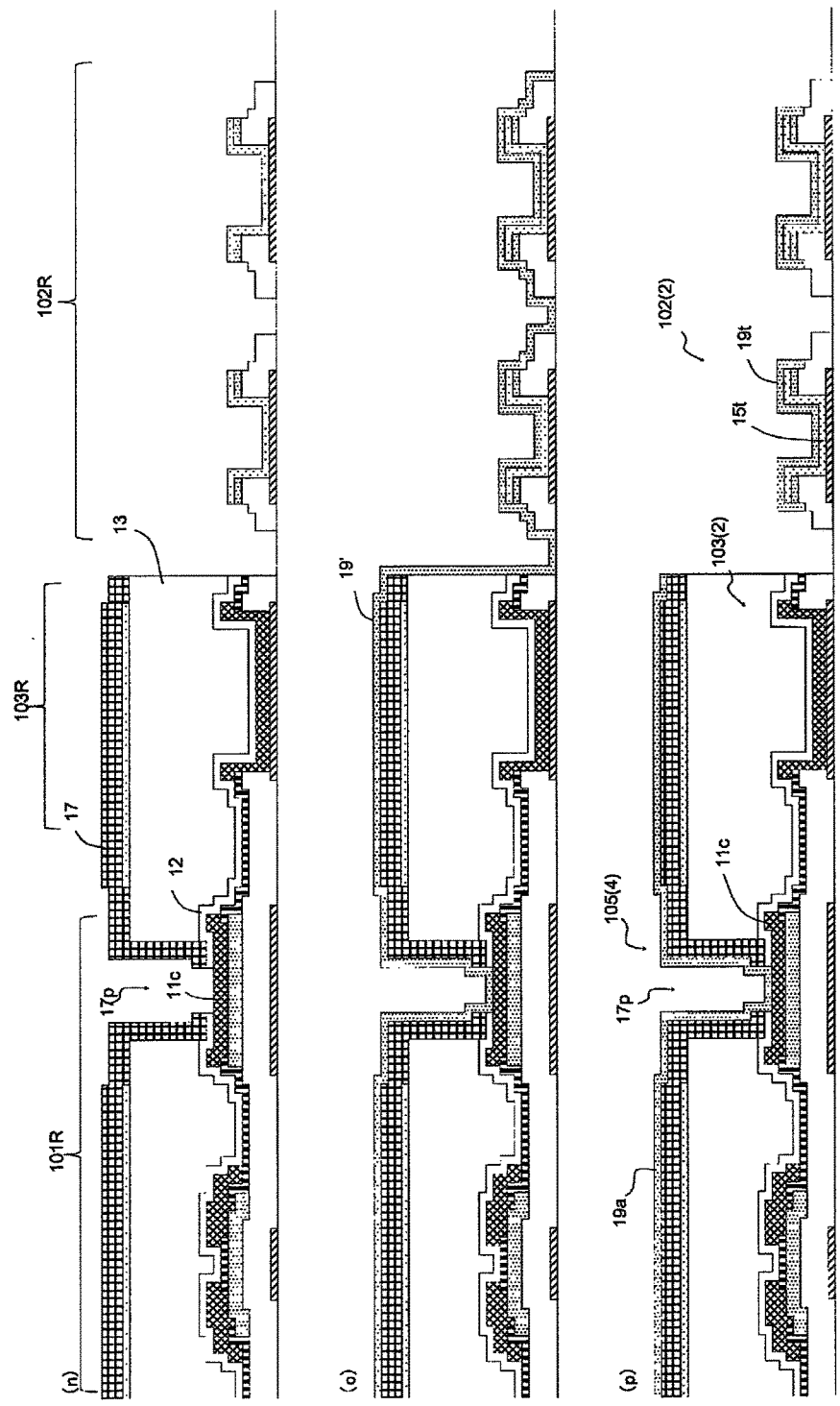
FIG. 15(n) to (p) are cross-sectional views illustrating respective manufacturing process steps to fabricate the semiconductor device according to the second embodiment of the present invention.

Subsequently, as shown in portion (o) of FIG. 15, a transparent conductive film 19' is deposited over the entire surface of the substrate 1 (as well as inside the hole 17p), and then patterned. In this manner, a second transparent conductive layer 19a to be pixel electrodes is formed in the transistor forming region 101R and in the S-G connecting portion forming region 103R as shown in portion (p) of FIG. 15. The second transparent conductive layer 19a contacts with the upper conductive layer 11c inside the hole 17p to form a contact portion 105(4). In the terminal portion forming region 102R, an upper transparent connecting layer 19t is formed to contact with the lower transparent connecting layer 15t. In this manner, a terminal portion 102(2) is obtained.

According to this embodiment, a highly reliable terminal portion 102 can be formed as easily as in the first embodiment described above. In addition, according to this embodiment, since the dielectric layer 17 can be formed with the surface of the upper conductive layer 11c coated with the first insulating layer 12 in the process step of forming a contact portion and a storage capacitor, the process damage to be done on the upper conductive layer 11c can be reduced. Furthermore, since the S-G connecting portion 103(2) has a structure in which the source line layer and the gate line layer directly contact with each other, its size and resistance can be reduced.

Embodiment 3

Hereinafter, a third embodiment of a semiconductor device according to the present invention will be described. In this third embodiment, a dielectric layer is provided in the vicinity of (or around) a contact hole of the terminal portion, which is a difference from the first embodiment described above. Since the TFT and the S-G connecting portion have the same structure as their counterparts of the first embodiment, description thereof will be omitted herein.

Figure 16:
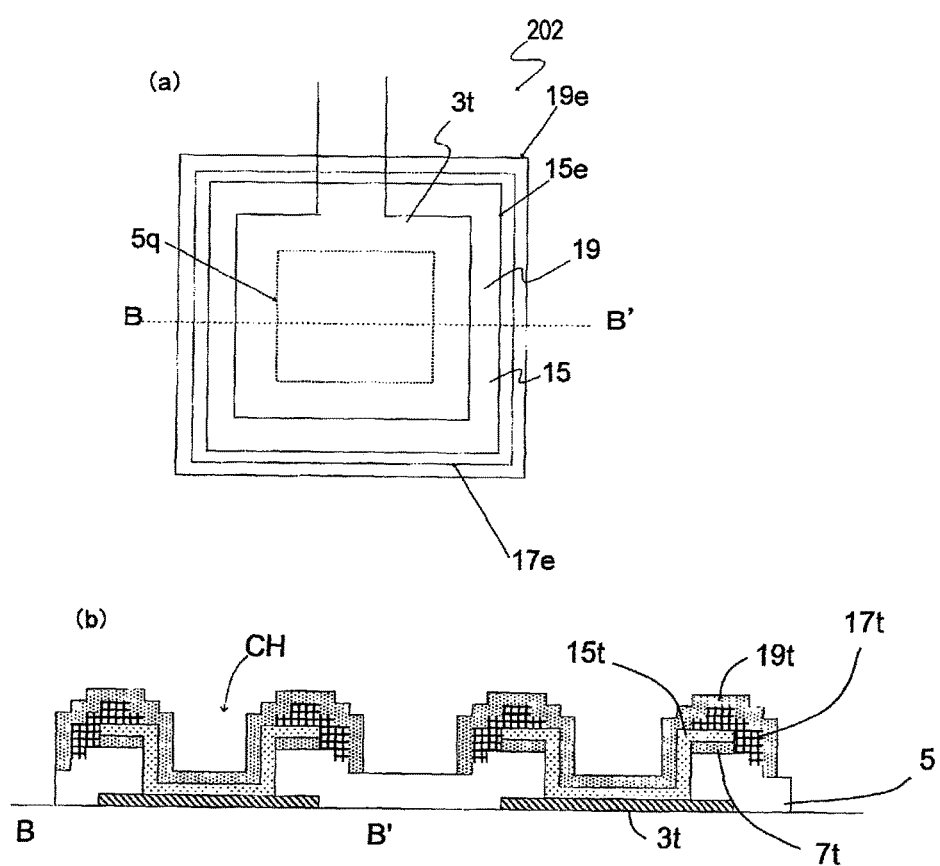
FIGS. 16(a) and (b) are respectively a plan view and a cross-sectional view illustrating a terminal portion 202 which has been formed in the peripheral area of a TFT substrate according to a third embodiment of the present invention.

FIGS. 16(a) and 16(b) are respectively a plan view and a cross-sectional view illustrating a terminal portion 202 which has been formed in the peripheral area of a TFT substrate. In FIG. 16, any component having substantially the same function as its counterpart shown in FIG. 2 is identified by the same reference numeral. Also, even though two adjacent terminals are shown in FIG. 16(b), the number of terminals is not particularly limited.

In this terminal portion 202, a dielectric layer 17t has been formed between the lower and upper transparent connecting layers 15t and 19t around the contact hole CH unlike the terminal portion 102 shown in FIG. 2. In this terminal portion 202, electrical connection between the upper transparent connecting layer 19t and the lower conductive layer 3t is established via the lower transparent connecting layer 15t.

In this embodiment, the lower conductive layer 3t has also been formed out of the same conductive film as the gate line 3, for example, as in the first embodiment. Also, the semiconductor layer 7t has been formed out of the same semiconductor film as the semiconductor layer 7a that is the active layer of the TFT 101. Furthermore, the dielectric layer 17t has also been formed out of the same dielectric film as the dielectric layer 17.

Just like the terminal portion 102 of the first embodiment, the terminal portion 202 also has a redundant structure comprised of the lower transparent connecting layer 15t and the upper transparent connecting layer 19t, and therefore, a high degree of reliability is ensured. If this embodiment is applied to a TFT substrate for use in an FFS mode display device, the lower transparent connecting layer 15t is suitably formed out of the same transparent conductive film as the common electrode, and the upper transparent connecting layer 19t is suitably formed out of the same conductive film as the pixel electrodes. By using such a pair of electrode layers to be the common electrode and the pixel electrodes, a terminal portion 202 with the redundant structure can be formed with an increase in the number of manufacturing process steps or the number of masks to use checked.

When viewed along a normal to the substrate 1, the semiconductor layer 7t, the dielectric layer 17t, and the upper and lower transparent connecting layers 19t, 15t suitably overlap with each other. Also, the dielectric layer 17t suitably contacts with not only the upper surface of the lower transparent connecting layer 15t but also the upper surface of the gate insulating layer 5 as well. As a result, since the dielectric layer 17 is arranged so as to cover the side surface of the lower transparent connecting layer 15t and the side surface of the semiconductor layer 7t opposite from the contact hole CH, the process damage to be done on the semiconductor layer 7t can be reduced.

As shown in FIG. 16, the end portion of the semiconductor layer 7t which faces the hole 7q may be aligned with the side surface of the gate insulating layer 5 which faces the hole 5q. Such a configuration can be obtained by cutting the hole 5q through the gate insulating layer 5 using the semiconductor layer 7t as an etching mask in the manufacturing process to be described later. Meanwhile, the side surface of the semiconductor layer 7t opposite from the hole 7q may be aligned with the side surface of the lower transparent connecting layer 15t. Such a configuration can be obtained by etching the semiconductor layer 7t and the lower transparent connecting layer 15t simultaneously in the manufacturing process to be described later.

Hereinafter, an exemplary method for fabricating the semiconductor device of this embodiment will be described. In the example to be described below, it will be described how to make the TFTs 101 and contact portion 105(3) shown in FIGS. 5A and 5B, the terminal portions 202 shown in FIG. 16, and the S-G connecting portions 103 shown in FIGS. 6A and 6B on the substrate 1 simultaneously. It should be noted that the manufacturing process of this embodiment is not limited to the exemplary one to be described below. Also, the respective configurations of the TFTs 101, contact portions 105, terminal portions 102, and S-G connecting portions 103 are appropriately changeable, too.

Figure 17:
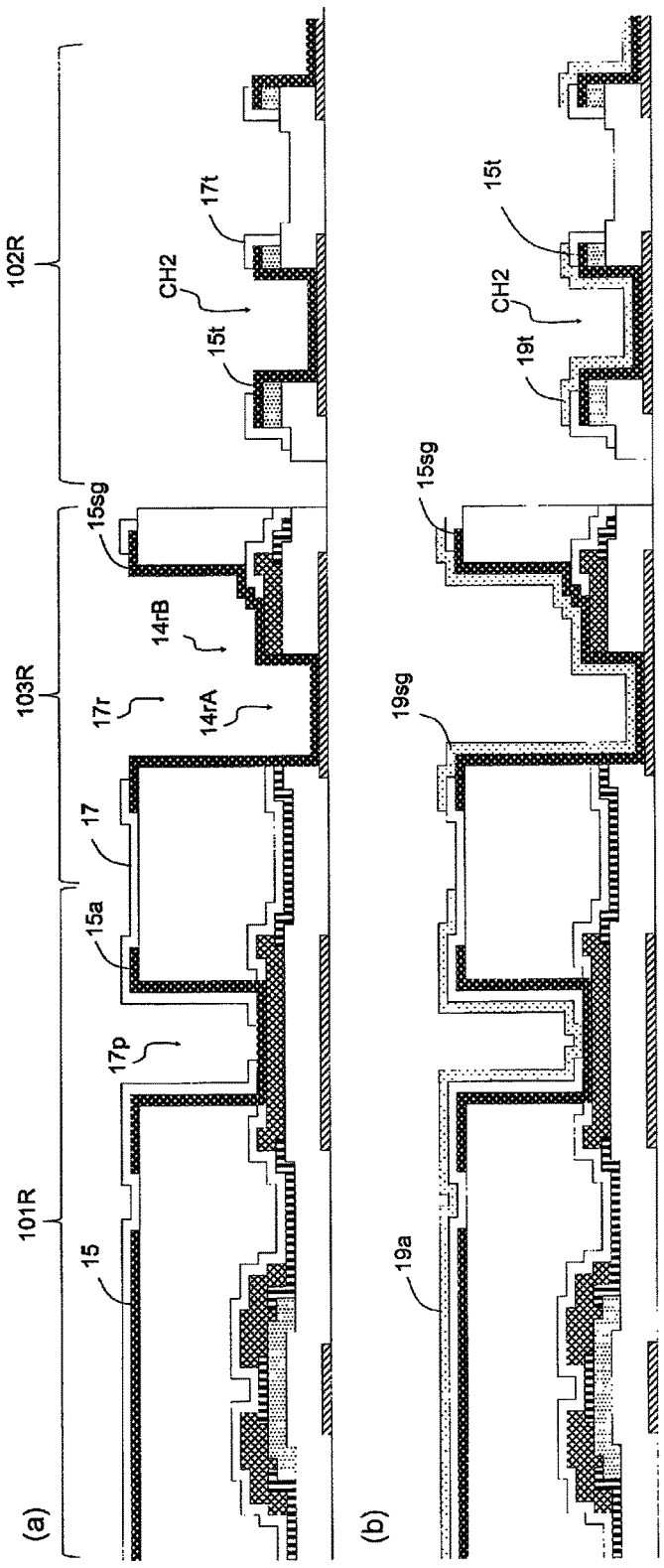
FIGS. 17(a) and (b) are cross-sectional views illustrating respective manufacturing process steps to fabricate the semiconductor device according to the third embodiment of the present invention.

The semiconductor device of this embodiment may also be fabricated following the flow shown in FIG. 8. Since STEPS 1 through 6 are the same as the process steps that have already been described with reference to FIGS. 9A, 9B and FIGS. 10A, 10B, description thereof will be omitted herein. FIGS. 17(a) and 17(b) are cross-sectional views illustrating STEPS 7 and 8, respectively.

STEPS 1 Through 6: Transistor Forming Process Steps (not Shown)

First of all, as in the process steps shown in FIGS. 9A, 9B and FIGS. 10A, 10B, a gate line, a semiconductor layer, a protective layer, source and drain, an interlevel insulating layer, and a first transparent conductive layer are formed on the substrate 1.

STEP 7: Dielectric Layer Forming Process Step (FIG. 17(a))

Next, a dielectric layer 17 is deposited by CVD process, for example, over the entire surface of the substrate 1. Thereafter, a resist mask (not shown) is formed on the dielectric layer 17 to etch the dielectric layer 17. As a result, as shown in FIG. 17(a), a hole 17p which exposes the drain connected transparent conductive layer 15a is cut through the dielectric layer 17 in the transistor forming region 101R. Meanwhile, in the S-G connecting portion forming region 103R, a hole 17r which exposes the lower transparent conductive layer 15sg is cut through the dielectric layer 17. In this example, the hole 17r is cut so that portions of the lower transparent conductive layer 15sg which are located inside the holes 14rA and 14rB are exposed entirely. And in the terminal portion forming region 102R, the dielectric layer 17 is formed in the vicinity of (or around) the second contact hole CH2 and on the lower transparent connecting layer 15t. The dielectric layer 17t is arranged to overlap with at least a portion of the semiconductor layer 7t when viewed along a normal to the substrate 1.

STEP 8: Second Transparent Conductive Layer Forming Process Step (FIG. 17(b))

Next, a transparent conductive film (not shown) is formed by sputtering process, for example, on the dielectric layer 17 and inside the holes 17p, 17r and the second contact hole CH2 and then patterned. In this manner, a second transparent conductive layer 19a is formed in the transistor forming region 101R as shown in FIG. 17(b). Meanwhile, in the S-G connecting portion forming region 103R, an upper transparent conductive layer 19sg which contacts with the lower transparent conductive layer 15sg inside the hole 17r is obtained. And in the terminal portion forming region 102R, the upper transparent connecting layer 19t of the terminal portion 102 is formed out of the transparent conductive film. The upper transparent connecting layer 19t contacts with the lower transparent connecting layer 15t inside the second contact hole CH2. At least a portion of the dielectric layer is located between the upper and lower transparent connecting layers 19t and 15t. Optionally, the end portion of the upper transparent connecting layer 19t may be located on the dielectric layer 17t as shown in FIG. 17(b). Alternatively, the end portion of the upper transparent connecting layer 19t may also be located on the gate insulating layer 5 and may cover the entire upper surface of the dielectric layer 17t and the side surface of the dielectric layer 17t opposite from the second contact hole CH2 as shown in FIG. 16(b).

Embodiment 4

Hereinafter, a fourth embodiment of a semiconductor device according to the present invention will be described.

A TFT and S-G connecting portion according to this fourth embodiment have the same configuration as their counterparts of the second embodiment described above. But a terminal portion according to this fourth embodiment has the same structure as its counterpart of the third embodiment. Thus, the configuration of the semiconductor device of this embodiment will not be described.

Figure 18:
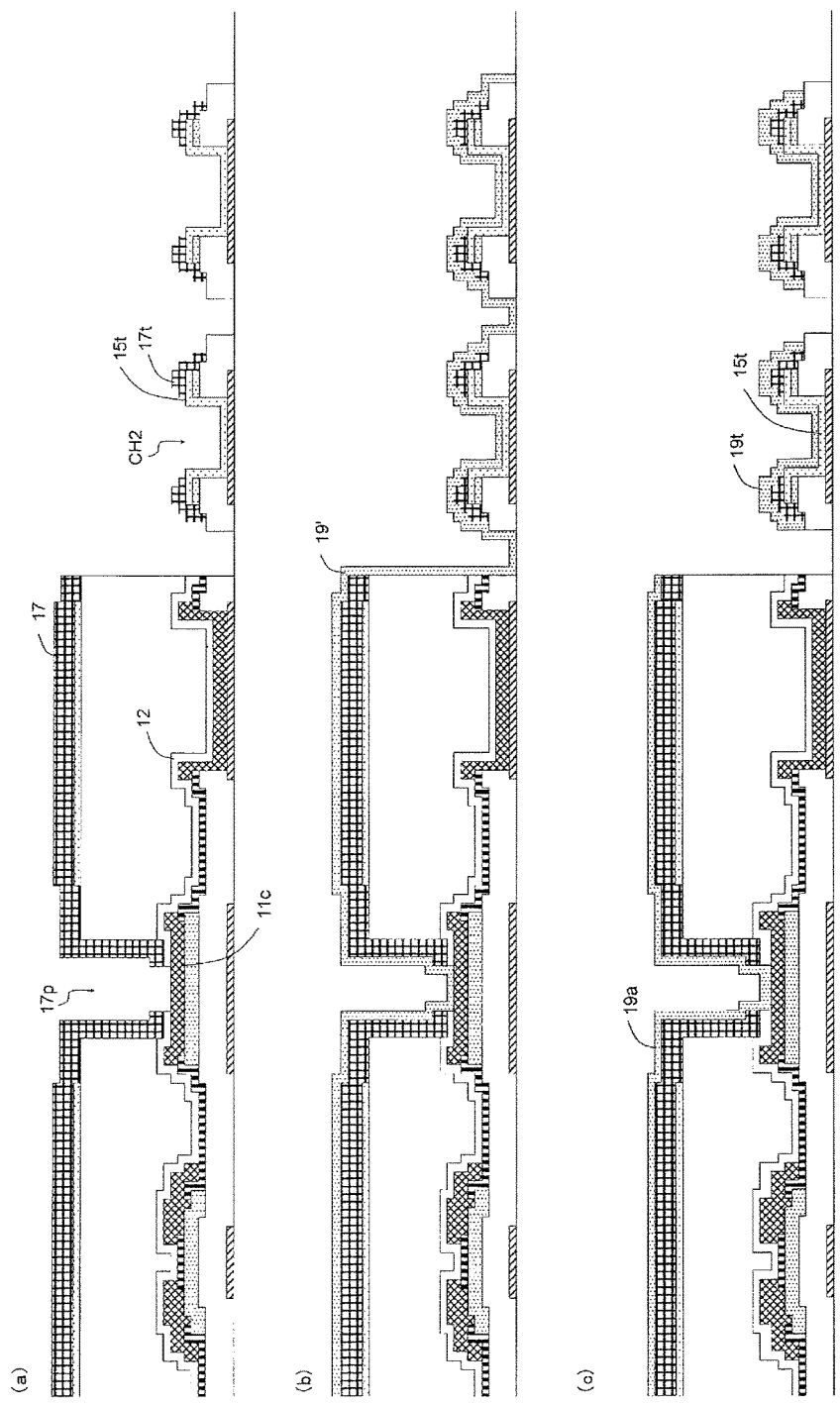
FIG. 18(a) to (c) are cross-sectional views illustrating respective manufacturing process steps to fabricate a semiconductor device according to a fourth embodiment of the present invention.

Hereinafter, an exemplary method for fabricating a semiconductor device according to this embodiment will be described. FIGS. 18(a) through 18(c) are cross-sectional views illustrating respective manufacturing process steps to fabricate the semiconductor device of this embodiment.

First of all, the manufacturing process is advanced to the process step of forming the dielectric layer 17 in the same way as the process that has already been described with reference to FIGS. 13 through 15.

Next, as shown in FIG. 18(a), the dielectric layer is patterned. As a result, in the transistor forming region 101R, a hole 17p which reaches the upper conductive layer 11c is cut through the dielectric layer 17 and the first insulating layer 12. Meanwhile, in the terminal portion forming region 102R, the dielectric layer 17 is formed so as to cover partially the lower transparent connecting layer 15t in the vicinity of the second contact hole CH2. The dielectric layer 17t is arranged so as to overlap at least a portion of the semiconductor layer 7t when viewed along a normal to the substrate 1.

Thereafter, as shown in FIG. 18(b), a transparent conductive film 19' is deposited over the entire surface of the substrate 1 and then patterned. As a result, in the transistor forming region 101R, a second transparent conductive layer 19a is formed as shown in FIG. 18(c). Meanwhile, in the terminal portion forming region 102R, the upper transparent connecting layer 19t of the terminal portion 102 is formed out of the transparent conductive film 19'. The upper transparent connecting layer 19t contacts with the lower transparent connecting layer 15t inside the second contact hole CH2 and also contacts with the dielectric layer 17t in the vicinity of the second contact hole CH2. In this example, the upper transparent connecting layer 19t has been formed to cover the dielectric layer 17t entirely and its end portion contacts with the gate insulating layer 5. Optionally, the end portion of the upper transparent connecting layer 19t may be located on the dielectric layer 17t.

INDUSTRIAL APPLICABILITY

Embodiments of the present invention are broadly applicable to any semiconductor device including a thin-film transistor and two transparent conductive layers on a substrate. Among other things, embodiments of the present invention are particularly effectively applicable to a semiconductor device including a thin-film transistor (such as an active-matrix substrate) and a display device including such a semiconductor device.

REFERENCE SIGNS LIST 1 substrate
3, G gate line
3a gate electrode
3c lower conductive layer
3t, 3sg lower conductive layer
5 gate insulating layer
7a, 7c, 7t semiconductor layer
9 protective layer
11, S source line
11s source electrode
11d drain electrode
11t, 11sg upper conductive layer
12 first insulating layer
13 second insulating layer
14 interlevel insulating layer
15 first transparent conductive layer
15a drain connected transparent conductive layer
15t lower transparent connecting layer
17, 17t dielectric layer
19a second transparent conductive layer
19t upper transparent connecting layer
100 semiconductor device
101 TFT
102, 202 terminal portion
103 S-G connecting portion
105 contact portion
1000 liquid crystal display device

The invention claimed is:

1. A semiconductor device, comprising:
a substrate and a thin-film transistor, a gate line layer, a source line layer, and a terminal portion on the substrate, the gate line layer including a gate line, a gate electrode of the thin-film transistor, and a lower conductive layer of the terminal portion, the source line layer including a source line and source and drain electrodes of the thin-film transistor, the thin-film transistor including the gate electrode, a gate insulating layer on the gate electrode, a first semiconductor layer on the gate insulating layer including an oxide semiconductor, a protective layer which covers at least a channel region of the first semiconductor layer, the source electrode, and the drain electrode, wherein
the semiconductor device further includes:
an interlevel insulating layer on the source and the drain electrodes including a first insulating layer that contacts with at least a surface of the drain electrode;
a first transparent conductive layer on the interlevel insulating layer;
a first dielectric layer on the first transparent conductive layer; and
a second transparent conductive layer on the first dielectric layer overlapping with at least a portion of the first transparent conductive layer with the first dielectric layer between them,
the terminal portion includes:
the lower conductive layer;
the gate insulating layer extended onto the lower conductive layer;
a second semiconductor layer on the gate insulating layer and formed out of the same semiconductor film as the first semiconductor layer;
a lower transparent connecting layer formed out of the same conductive film as the first transparent conductive layer;
an upper transparent connecting layer on the lower transparent connecting layer and formed out of the same conductive film as the second transparent conductive layer, and
a second dielectric layer between the upper transparent connecting layer and the lower transparent connecting layer,
the gate insulating layer and the second semiconductor layer include a contact hole, and side surfaces of the gate insulating layer and the second semiconductor layer on a side of the contact hole are aligned with each other, the lower transparent connecting layer is inside the contact hole and on the second semiconductor layer and contacts with the lower conductive layer in the contact hole, the upper transparent connecting layer contacts with the lower transparent connecting layer at a bottom and on a sidewall of the contact hole, the second dielectric layer covers a side surface of the lower transparent connecting layer and a side surface of the second semiconductor layer opposite to the contact hole, and contacts with an upper surface of the gate insulating layer, and the upper transparent connecting layer covers an entire upper surface of the second dielectric layer and a side surface of the second dielectric layer opposite to the contact hole.

2. The semiconductor device of claim 1, wherein the side surface of the lower transparent connecting layer is aligned with the side surface of the second semiconductor layer on an opposite side of the contact hole.

3. A display device comprising:
the semiconductor device of claim 1;
a counter substrate arranged so as to face the semiconductor device; and
a liquid crystal layer interposed between the counter substrate and the semiconductor device,
wherein the display device includes a plurality of pixels arranged in a matrix pattern, and
the second transparent conductive layer is divided into multiple portions which are allocated to the respective pixels and which function as pixel electrodes.

4. The display device of claim 3, wherein the second transparent conductive layer has a plurality of slit holes in each said pixel, and
the first transparent conductive layer is located at least under the plurality of holes and functions as a common electrode.

5. The semiconductor device of claim 1, wherein the oxide semiconductor includes an In—Ga—Zn—O-based semiconductor.

6. A semiconductor device, comprising:
a substrate; and
a terminal portion on the substrate, wherein
the terminal portion includes:
a lower conductive layer on the substrate;
an insulating layer covering the lower conductive layer;
a semiconductor layer on the insulating layer and includes an oxide semiconductor;
a lower transparent connecting layer;
an upper transparent connecting layer on the lower transparent connecting layer;
a dielectric layer between the upper transparent connecting layer and the lower transparent connecting layer,
the insulating layer and the semiconductor layer include a contact hole,
respective side surfaces of the insulating layer and the semiconductor layer on a side of the contact hole are aligned with each other,
the lower transparent connecting layer is inside the contact hole and on the semiconductor layer and contacts with the lower conductive layer inside the contact hole,
the upper transparent connecting layer contacts with the lower transparent connecting layer at a bottom and on a sidewall of the contact hole,
the dielectric layer covers a side surface of the lower transparent connecting layer and a side surface of the semiconductor layer opposite to the contact hole, and contacts with an upper surface of the insulating layer, and
the upper transparent connecting layer covers an entire upper surface of the dielectric layer, a side surface of the dielectric layer opposite to the contact hole, and directly contacts the insulating layer.

7. The semiconductor device of claim 6, wherein the oxide semiconductor includes an In—Ga—Zn—O-based semiconductor.

* * * * *